(12) United States Patent
Agarwal et al.

(10) Patent No.: US 12,381,127 B2
(45) Date of Patent: Aug. 5, 2025

(54) SEMICONDUCTOR CHIP DEVICE INTEGRATING THERMAL PIPES IN THREE-DIMENSIONAL PACKAGING

(71) Applicant: ADVANCED MICRO DEVICES, INC., Santa Clara, CA (US)

(72) Inventors: Rahul Agarwal, Santa Clara, CA (US); Raja Swaminathan, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 90 days.

(21) Appl. No.: 17/554,968

(22) Filed: Dec. 17, 2021

(65) Prior Publication Data

US 2023/0197563 A1 Jun. 22, 2023

(51) Int. Cl.
*H01L 23/427* (2006.01)
*H10B 12/00* (2023.01)

(52) U.S. Cl.
CPC ........... *H01L 23/427* (2013.01); *H10B 12/50* (2023.02)

(58) Field of Classification Search
CPC .................. H01L 23/367; H01L 2225/06541
See application file for complete search history.

(56) References Cited

U.S. PATENT DOCUMENTS

| | | |
|---|---|---|
| 3,761,310 A | 9/1973 | Preobrazhentsev et al. |
| 6,219,243 B1 | 4/2001 | Ma et al. |
| 8,779,599 B2 | 7/2014 | Lin et al. |
| 9,224,697 B1 | 12/2015 | Kwon et al. |
| 9,258,890 B2 | 2/2016 | Seguido et al. |
| 9,397,623 B1 | 7/2016 | LaCroix |
| 9,613,931 B2 | 4/2017 | Lin et al. |
| 9,966,362 B1 * | 5/2018 | Ngai ................... H01L 25/0657 |
| 10,312,221 B1 | 6/2019 | Agarwal et al. |
| 10,431,517 B2 | 10/2019 | Wuu et al. |
| 2008/0251911 A1 * | 10/2008 | Farnsworth ......... H01L 23/4093 257/714 |
| 2009/0243086 A1 | 10/2009 | Warren |
| 2012/0043669 A1 | 2/2012 | Refai-Ahmed et al. |
| 2014/0312491 A1 | 10/2014 | Jin et al. |

(Continued)

FOREIGN PATENT DOCUMENTS

| | | | | |
|---|---|---|---|---|
| CN | 108155153 A | * | 6/2018 | ......... H01L 21/6835 |
| CN | 112185909 A | * | 1/2021 | ............. H01L 23/31 |

(Continued)

OTHER PUBLICATIONS

Samal et al., Adaptive Regression-Based Thermal Modeling and Optimization for Monolithic 3-D ICs; IEEE Transactions on Computer-Aided Design of Integrated Circuits and Systems, vol. 35, No. 10, dated Oct. 2016, 14 pages.

*Primary Examiner* — Edward Chin

(57) ABSTRACT

In an implementation, a semiconductor chip device includes a first semiconductor chip that includes a first portion and a second portion. The first portion can be a higher heat producing portion and the second portion can be a lower heat producing portion. A second semiconductor chip is stacked on the first semiconductor chip over the second portion. A dummy component is stacked on the first semiconductor chip over the first portion. The dummy component includes a plurality of thermal pipes providing a thermal path from a first surface of the dummy component to an opposite second surface of the dummy component.

20 Claims, 20 Drawing Sheets

(56) References Cited

U.S. PATENT DOCUMENTS

| | | |
|---|---|---|
| 2015/0311182 A1 | 10/2015 | Lee et al. |
| 2016/0070318 A1 | 3/2016 | Wu et al. |
| 2018/0012857 A1 | 1/2018 | Lin |
| 2018/0138101 A1 | 5/2018 | Yu et al. |
| 2018/0158749 A1* | 6/2018 | Yu ......................... H01L 23/538 |
| 2019/0006263 A1* | 1/2019 | Yu ....................... H01L 25/0657 |
| 2019/0067152 A1 | 2/2019 | Wuu et al. |
| 2019/0393123 A1 | 12/2019 | Wuu et al. |
| 2019/0393124 A1 | 12/2019 | Wuu et al. |
| 2020/0006194 A1* | 1/2020 | Huang ................ H01L 23/3675 |
| 2020/0203470 A1* | 6/2020 | Dhane .................. H01L 23/367 |
| 2020/0365485 A1* | 11/2020 | Hu ....................... H01L 25/0657 |
| 2021/0193581 A1* | 6/2021 | Seo ..................... H01L 23/5386 |

FOREIGN PATENT DOCUMENTS

| | | | | |
|---|---|---|---|---|
| CN | 114171414 A | * | 3/2022 | |
| KR | 20210057870 A | * | 5/2021 | |
| WO | WO-2023104092 A1 | * | 6/2023 | ............. H01L 21/50 |

* cited by examiner

```
┌─────────────────────────────────────────────────────────────┐
│ Provide A First Semiconductor Chip That Includes A First    │
│ Portion That Generates More Heat Than A Second Portion 1802 │
└─────────────────────────────────────────────────────────────┘
```
```
┌─────────────────────────────────────────────────────────────┐
│ Stack At Least One Second Semiconductor Chip On The First   │
│ Semiconductor Chip Over The Second Portion Of The First     │
│ Semiconductor Chip 1804                                     │
│                                                             │
│  ┌───────────────────────────────────────────────────────┐  │
│  │ Mount A Stack Of Plural Second Semiconductor Chips On │  │
│  │ The First Semiconductor Chip 1902                     │  │
│  └───────────────────────────────────────────────────────┘  │
└─────────────────────────────────────────────────────────────┘
```
```
┌─────────────────────────────────────────────────────────────┐
│ Stack A Dummy Component On The First Semiconductor Chip     │
│ Over The First Portion Of The First Semiconductor Chip,     │
│ Wherein The Dummy Component Includes A Plurality Of         │
│ Thermal Pipes Providing A Thermal Path From A First         │
│ Surface Of The Dummy Component To An Opposite Second        │
│ Surface Of The Dummy Component 1806                         │
│                                                             │
│  ┌───────────────────────────────────────────────────────┐  │
│  │ Mount A Stack Of Plural Dummy Chips On The First      │  │
│  │ Semiconductor Chip 1904                               │  │
│  └───────────────────────────────────────────────────────┘  │
└─────────────────────────────────────────────────────────────┘
```

FIG. 19

SEMICONDUCTOR CHIP DEVICE INTEGRATING THERMAL PIPES IN THREE-DIMENSIONAL PACKAGING

BACKGROUND

Many current integrated circuits are formed as multiple dies on a common wafer. After the basic process steps to form the circuits on the dies are complete, the individual dies are singulated from the wafer. The singulated die are then often mounted to structures, such as circuit boards, or packaged in some form of enclosure. One frequently used package structure employs a stacked die arrangement.

Stacked die arrangements involve placing or stacking one or more semiconductor chips on a base semiconductor chip. In some conventional variants, the base semiconductor chip is a high heat dissipating device such as a microprocessor. The stacked chips are sometimes memory devices. In a typical microprocessor design, the chip itself has a floor plan with various types of logic blocks, such as floating point, integer, input/output management, and cache blocks frequently interspersed among each other. The power densities of the blocks can vary. For example, some blocks can have relatively higher power densities and some can have relatively lower power densities.

BRIEF DESCRIPTION OF THE DRAWINGS

FIG. 19 is a flowchart of another example method of fabricating a semiconductor chip device integrating thermal pipes in three-dimensional packaging according to some implementations.

DETAILED DESCRIPTION

Figure 1:
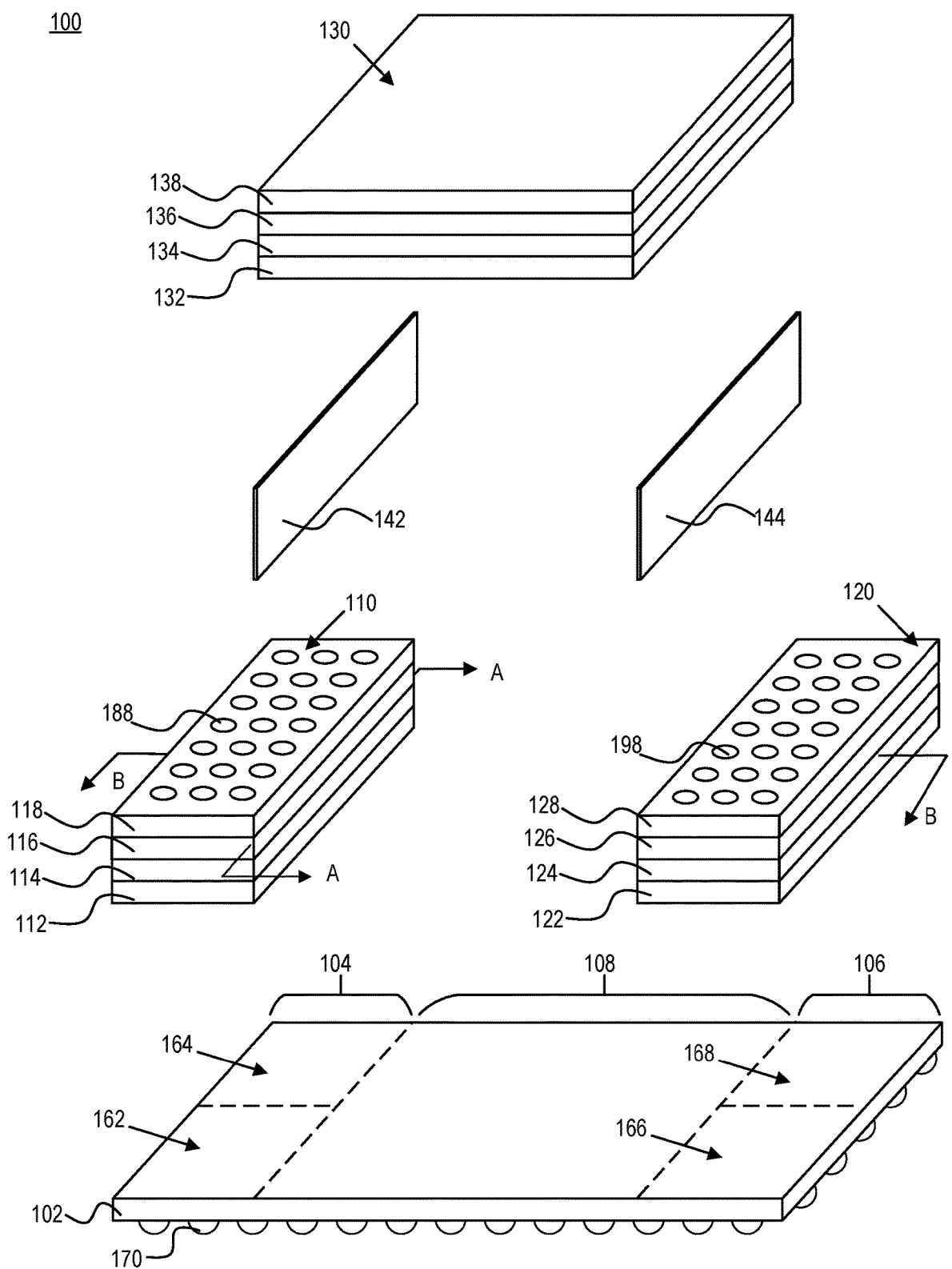
FIG. 1 sets forth an exploded view of an example semiconductor chip device integrating thermal pipes in three-dimensional packaging according to some implementations of the present disclosure.

Stacked semiconductor chip devices present a host of design and integration challenges for scientists and engineers. One design issue associated with stacked semiconductor chips is thermal management. Semiconductor chips dissipate heat as a result of resistive losses, which can interfere with the operation of other chips and components that are co-packaged with the chip. Thermal management of semiconductor chips in a stacked arrangement remains a technical challenge because a given semiconductor chip in a stacked arrangement, whether the first, an intermediary, or the last in the particular stack, can dissipate heat to such an extent that active thermal management is necessary in order to either prevent the one or all of the semiconductor chips in the stack from entering thermal runaway. Thermal runaway refers to a situation in which the current in a chip increases drastically as a result of local heating. Such Thermal runaway can lead to device failure.

One solution for thermal dissipation with stacks including high powered processors involves placing the processor as the top chip in a stack of chips (i.e., closest to heat sink), although such techniques introduce a new power delivery challenge. For example, power, ground, and input/output signals require routing up through the underlying lower power chips. This requires dense microbumps and through-silicon vias through the stacked chips, which represents significant area overheads for the stacked chips.

Another solution for thermal dissipation with stacks including high powered processors involves placing dummy components over portions of the processor that generate a relatively high amount of heat and placing lower power chips over portions of the processor that generate a relatively lower amount of heat. For example, heat is transferred from the high heat-generating portion (e.g., a portion that contains a processor core) through the dummy component to a heat sink above the dummy component. However, dissipated heat can compromise the integrity of the bond between the dummy component and the processor. Also, insulating material in the bonding layer can inhibit thermal flux transfer.

To address the issues described above, various implementations a semiconductor chip device are disclosed. The semiconductor chip device includes a first semiconductor chip that, in turn, includes a first portion and a second portion. A second semiconductor chip is stacked on the first semiconductor chip over the second portion. A dummy component is stacked on the first semiconductor chip over the first portion. The dummy component includes a plurality of thermal pipes providing a thermal path from a first surface of the dummy component to an opposite second surface of the dummy component. In some examples, the first portion of the first semiconductor chip generates more heat than the second portion of the first semiconductor chip.

In some implementations, the second semiconductor chip is coupled to the first semiconductor chip by a hybrid bond and the hybrid bond metallurgically couples bond pads on the second semiconductor chip to through-silicon vias in the first semiconductor chip.

In some implementations, the thermal pipes are respectively coupled to bond pads on the dummy component. In these examples, the dummy component is coupled to the first semiconductor chip by a hybrid bond in which the bond pads are coupled to a substrate surface of the first semiconductor chip.

In some implementations, the dummy component includes plural dummy components stacked together. In some implementations, the dummy component lacks integrated circuitry. In some implementations, the thermal pipes are composed of copper.

Another implementation of a semiconductor chip device is also disclosed. Such a semiconductor chip device includes a first semiconductor chip including a first portion and a second portion. A stack of plural second semiconductor chips is positioned over the second portion. The stack of second semiconductor chips includes a bottom second semiconductor chip mounted on a back surface of the first semiconductor chip and one or more additional second semiconductor chips stacked on the bottom second semiconductor chip. A stack of plural dummy chips is positioned over the first portion. Each dummy chip includes a plurality of thermal pipes providing a thermal path from a first surface of the dummy chip to an opposite second surface of the dummy chip. In some examples, the first portion of the first semiconductor chip generates more heat than the second portion of the first semiconductor chip.

In some implementations, the stack of dummy chips includes a bottom dummy chip mounted on the first semiconductor chip and one or more additional dummy chips stacked on the bottom dummy chip. The plurality of thermal pipes in each of the one or more additional dummy chips aligns with the plurality of thermal pipes in the bottom dummy chip. In some examples, adjacent dummy chips in the stack of dummy chips are coupled by a hybrid bond. In some examples, adjacent second semiconductor chips in the stack of second semiconductor chips are coupled by a hybrid bond.

In some implementations, a heat spreader is positioned on the stack of second semiconductor chips and the stack of dummy chips. In some implementations, the stack of second semiconductor chips includes a memory chip. In some implementations, the first portion of the first semiconductor chip includes one or more processor cores and wherein the second portion of the first semiconductor chip includes logic other than the one or more processor cores. In some implementations, the thermal pipes are composed of copper.

Another variation of the embodiment in accordance with the present disclosure is directed to a method of fabricating a semiconductor chip device integrating thermal pipes in three-dimensional packaging. The method includes providing a first semiconductor chip that includes a first portion that generates more heat than a second portion. The method also includes stacking at least one second semiconductor chip on the first semiconductor chip over the second portion of the first semiconductor chip. The method also includes stacking a dummy component on the first semiconductor chip over the first portion of the first semiconductor chip. The dummy component includes a plurality of thermal pipes providing a thermal path from a first surface of the dummy component to an opposite second surface of the dummy component. In some examples, the first portion of the first semiconductor chip includes one or more processor cores and the second portion of the first semiconductor chip includes logic other than the one or more processor cores.

In some implementations, stacking the at least one second semiconductor chip over the second portion of the first semiconductor chip includes mounting a stack of plural second semiconductor chips on the first semiconductor chip. In some implementations, stacking the dummy component on the first semiconductor chip over the first portion of the first semiconductor chip includes mounting a stack of plural dummy chips on the first semiconductor chip.

In some implementations, the method also includes fabricating the stack of second semiconductor chips and the stack of dummy chips. Fabricating the stack of second semiconductor chips and the stack of dummy chips includes processing, concurrently, a first-tier dummy chip to expose the thermal pipes and a first-tier second semiconductor chip to expose through-silicon vias. Fabricating the stack of second semiconductor chips and the stack of dummy chips also includes stacking a second-tier dummy chip on the first-tier dummy chip and stacking a second-tier second semiconductor chip on the first-tier second semiconductor chip. Fabricating the stack of second semiconductor chips and the stack of dummy chips also includes forming, concurrently, a first hybrid bond between the first-tier dummy chip and the second-tier dummy chip and a second hybrid bond between the first-tier second semiconductor chip and the second-tier second semiconductor chip.

In some implementations, a device includes a printed circuit board, a processing component mounted to the printed circuit board, and one or more memory components mounted to the printed circuit board and coupled to the processing component. The processing component includes a first semiconductor chip comprising a first portion and a second portion; a stack of second semiconductor chips positioned over the second portion, the stack of semiconductor chips including a bottom semiconductor chip mounted on a back surface of the first semiconductor chip and one or more additional semiconductor chips stacked on the bottom semiconductor chip; and a stack of dummy chips positioned over the first portion, wherein each dummy chip includes a plurality of thermal pipes providing a thermal path from a first surface of the dummy chip to an opposite, second surface of the dummy chip.

Implementations in accordance with the present disclosure will be described in further detail beginning with FIG. 1. Like reference numerals refer to like elements throughout the specification and drawings. FIG. 1 sets forth a partially exploded view of an example semiconductor chip device 100 in accordance with some implementations of the present disclosure. Implementations of the semiconductor device 100 are useful in high performance applications, such as a personal computer, a notebook, a tablet, a smart phone, a storage data center, or in applications involving large scale databases and/or analytics, such as finance, life sciences, and/or artificial intelligence. Many other applications are possible. Additionally, the example semiconductor package assembly 100 is assembled as described herein in a manner that includes dummy components stacked on a high heat producing area of a semiconductor chip. The dummy components include thermal transfer structures, or 'thermal pipes' that provide a thermal pathway to transfer heat away from the high heat producing area of the semiconductor chip. In some examples, these thermal pipes are through-silicon vias that are filled with a thermal transfer material such as copper. Thus, a heat spreader or heat sink may be placed in thermal contact with the thermal transfer structures to dissipate heat generated by the high heat producing area of the semiconductor chip.

More specifically, FIG. 1 depicts a partially exploded pictorial view of an exemplary semiconductor chip device 100 that includes a base semiconductor chip 102, one or more stacked semiconductor chips 132, 134, 136, 138 (also referred to herein as 'chip stack 130') that are stacked on the base semiconductor chip 102 and one or more dummy components 110, 120 that are mounted at select locations on the base semiconductor chip 102 for thermal management purposes. In some implementations, the dummy components 110, 120 are monolithic, while in other implementations the dummy components 110, 120 are formed as a stack of dummy components. In some variations, the dummy component 110 is configured as a stack of two or more dummy chips 112, 114, and so on, and the dummy component 120 is configured as a stack of two or more dummy chips 122, 124, and so on. As depicted in FIG. 1, the dummy component 110 includes stacked dummy chips 112, 114, 116, 118 and the dummy component 120 includes stacked dummy chips 122, 124, 126, 128. Thus, the dummy component 110 is sometimes referred to herein as a 'dummy component stack 110' and dummy component 120 is sometimes referred to herein as a 'dummy component stack 120.' The chip stack 130 is bracketed by two insulating layers 142, 144 that are positioned in respective narrow gaps between the chip stack 130 and the dummy components 110, 120.

In some examples, the semiconductor chip 102 has a floor plan that includes two high heat producing portions 104, 106 positioned to either side of a centrally located low heat producing portion 108. As used herein, the terms 'high' and 'low' signify that the low heat producing portion 108 generates less heat than either of the high heat producing portions 104, 106 or the combination of the high heat producing portions 104, 106. For example, as depicted in FIG. 1, the high heat producing area 104 is a portion of the base semiconductor chip 102 that includes one or more processor cores 162, 164 and the high heat producing area 106 is a portion of the base semiconductor chip 102 that includes one or more processor cores 166, 168. A processor core is a computational portion or execution unit of the base semiconductor chip 102. It should also be understood that fewer or more than four logic cores can be implemented in the base semiconductor chip 102.

In some examples, the low heat producing portion 108 includes logic other than processor cores. For example, the low heat producing area 108 can include bus logic, input/output ('I/O') logic, cache logic or the like. Thus, with the floor plan of the base semiconductor chip 102 depicted in FIG. 1, the low heat producing portion 108 is positioned in a separate location from the high heat producing portions 104, 106 so that the chip stack 130 can be mounted where there is relatively lesser heat dissipation.

To interface electrically with another component such as a circuit board or other device, the base semiconductor chip 102 includes plural I/O structures 170. For example, the I/O structures 170 can be solder balls, solder bumps, conductive pillars, or other types of interconnect structures. Well-known lead-free solders, such as tin-silver, tin-silver-copper or others can be used. In various examples, conductive pillars of copper, gold, aluminum, combinations of the these or the like are used with or without solder caps.

In some implementations, as will be explained in greater detail below, the low heat producing portion 108 of the base semiconductor chip 102 includes multiple through-silicon vias (TSVs) (not depicted in FIG. 1) that are configured to couple to respective interconnects (not depicted in FIG. 1) of the bottom chip 132 in the chip stack 130. In these implementations, the stacked semiconductor chips 132, 134, 136, 138 each include multiple TSVs (not shown in FIG. 1) for coupling to interconnects (both not shown in FIG. 1) of adjacent chips in the chip stack 130. Thus, in some examples, the arrangement in FIG. 1 is suitable for implementing a stack of interconnected memory chips (i.e., the chip stack 130) on the low heat producing portion 108 of the base semiconductor chip 102. In some examples, one or more stacked semiconductor chips 132, 134, 136, 138 is a memory chip (e.g., a dynamic random access memory (DRAM) chip). In some implementations, as will be explained in greater detail below, adjacent chips in the chip stack 130 are coupled by a hybrid bond.

Figure 2:
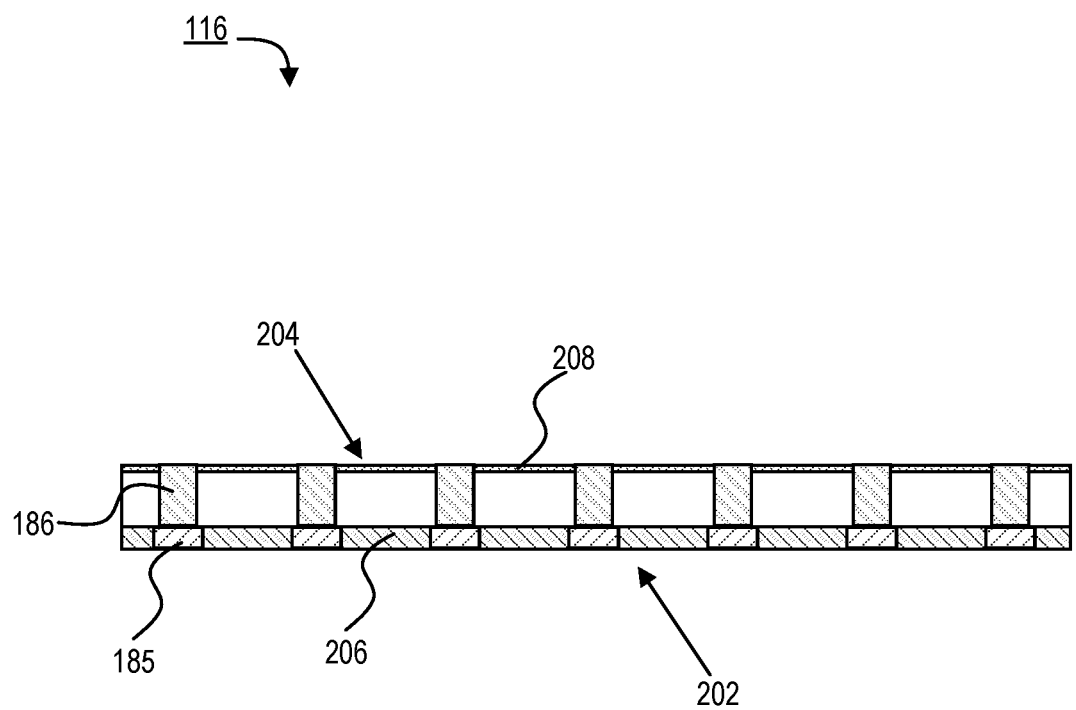
FIG. 2 is sets forth a sectional view of a dummy component of a semiconductor chip device integrating thermal pipes in three-dimensional packaging according to some implementations.

For further illustration, FIG. 2 sets forth a sectional view of example dummy chip 116 taken at section A-A of FIG. 1. In FIG. 2, the example dummy chip 116 is composed of bulk material such as silicon and includes an insulating layer 206 forming a front surface 202 of the dummy chip 116. The insulating layer 206 includes multiple metal bond pads 185 interspersed in an electrically insulating material such as silicon oxide. The insulating layer 206 can be on the order of less than 100 microns in thickness and deposited using, for example, plasma enhanced chemical vapor deposition (PECVD). In some examples, the metal bond pads 185 are composed of copper.

The example dummy chip 116 also includes multiple thermal pipes 186 coupled to the bond pads 185. The thermal pipes 186 extend from the bond pad 185 on the front surface 202 of the dummy chip 116 through bulk material (e.g., silicon) of the dummy chip 116 to the back surface 204 of the dummy chip 116. The thermal pipes 186 can be composed of any material having thermal properties that are conducive to heat transfer. For example, in some implementations, the thermal pipes are composed of copper. Thus, the thermal pipes 186 provide a thermal pathway from the front surface 202 of the dummy chip 116 to the back surface 204 of the dummy chip. In some implementations, the thermal pipes 186 are through-silicon vias formed by boring or laser drilling and filled with copper. Thus, the dummy chip 116 can be fabricated through techniques used for creating through-silicon vias in logic chips or other active components. However, the dummy chip 116 (and other dummy chips in the stack) does not include integrated circuitry or back end of line (BEOL) dielectric material that would inhibit thermal transfer through the dummy chip 116. The through-silicon vias that contain the thermal pipes lack a dielectric liner common to conventional through-silicon vias.

In some examples, an insulating film 208 is deposited on the back surface 204 of the dummy chip 116. The insulating film 208 in some implementations is a silicon oxynitride laminate that will form part of a hybrid bond with the insulating layer on the front surface of the dummy chip 118. Although depicted here for clarity, in FIG. 1 the insulating film 208 would not be distinct from a hybrid bond layer between the dummy chip 118 and the dummy chip 116. The insulating film can be on the order of fractions of microns in thickness and deposited using, for example, PECVD. For illustrative purposes, dummy chip 116 is used as a representative dummy chip in the dummy component stack 110. However, it should be understood that all of the dummy chips 112, 114, 116, 118 in the dummy component stack 110 can have the same configuration. Thus, the thermal pipes in each dummy chip align with the thermal pipes of the adjacent dummy chips in the stack.

FIG. 2 sets forth an example semiconductor chip that includes both a low heat producing portion and a high heat producing portion. However, some implementations include a uniform thermal map that spans the entirety (or substantially the entirety) of the semiconductor chip. In such implementations, a single dummy chip or stack of dummy chips that include the previously described thermal pipes may be utilized to provide heat transfer from the uniform thermal map.

Figure 3:
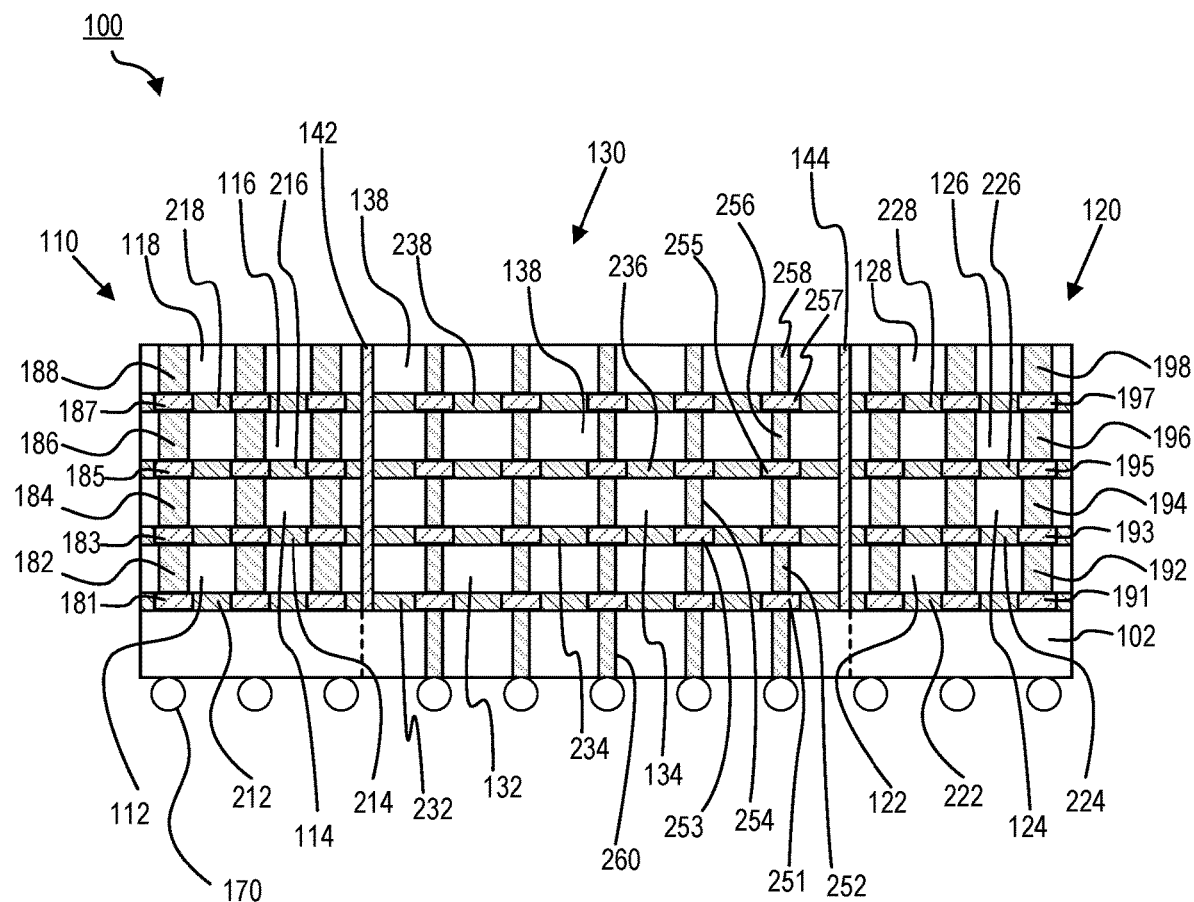
FIG. 3 is sets forth a sectional view of the semiconductor chip device integrating thermal pipes in three-dimensional packaging depicted in FIG. 1.

For further illustration, FIG. 3 sets forth a sectional view of the example semiconductor chip device taken at section B-B. As noted above, the dummy components 110, 120 are preferably positioned on the high heat producing areas 104, 106 of the semiconductor chip 102 while the chip stack 130 is mounted on the low heat producing area 108 of the semiconductor chip 102. The dummy components 110, 120 provide a thermal transfer pathway away from the high heat producing areas 104, 106. In this way, a heat spreader or heat sink can be positioned on the dummy components 110, 120 and also placed in thermal contact with the top-most stacked chip 138 to convey heat away from the high heat producing areas 104, 106 and even the low heat producing area 108.

In some implementations, the top dummy chip 118 of the dummy component 110 is thermally and mechanically coupled to the dummy chip 116 by way of hybrid bond layer 212. In some examples, the hybrid bond layer 212 includes an insulating layer of the dummy chip 118 and an insulating layer 208 of the dummy chip 116 bonded together by annealing. In one example, the hybrid bond layer 212 includes a bond between a laminate of a silicon oxynitride layer on the back surface 204 of the dummy chip 116 and a silicon oxide layer on the front surface of the dummy chip 118, which can be stoichiometric or non-stoichiometric. In this example, the hybrid bond layer 218 includes a metallurgical bond between the metal bond pad 187 of the dummy chip 118 that is interspersed in a silicon oxide layer to the thermal pipe 186 of the dummy chip 116. The thermal pipe 186 of dummy chip 116 projects up through a silicon oxynitride layer. In some examples, the bond pad 187 and the thermal pipe 186 are metallurgically bonded by way of an anneal process. Thus, as will be explained in greater detail below, the dummy chip 118 is positioned on the dummy chip 116 so that the insulating layer on the front surface of the dummy chip 118 contacts the insulating film on the back surface of the dummy chip 116 and the bond pad 187 is on or in very close proximity to the thermal pipe 186. Thereafter, for example, an annealing process is performed which produces a transitory thermal expansion of the bond pad 187 and the thermal pipe 186 bringing those structures into physical contact and causing them to form a metallurgical bond that persists even after cooling and thermal contraction. In some implementations, there is also formed an oxide/oxynitride bond between the silicon oxide layer and the silicon oxynitride film.

The hybrid bond layer 218 joins the top dummy chip 118 to the dummy chip 116. A similar hybrid bond layer 216 joins the dummy chip 116 to the dummy chip 114 such that the bond pad 185 of dummy chip 116 is metallurgically bonded to the thermal pipe 184 of dummy chip 114, and an insulating bond is formed between insulating layers on the front surface of the dummy chip 116 and the back surface of the dummy chip 114. A similar hybrid bond layer 214 joins the dummy chip 114 to the dummy chip 112 such that the bond pad 183 of dummy chip 114 is metallurgically bonded to the thermal pipe 182 of dummy chip 112, and an insulating bond is formed between insulating layers on the front surface of the dummy chip 114 and the back surface of the dummy chip 112.

A hybrid bond layer 212 joins the dummy chip 112 to the base semiconductor chip 102. The hybrid bond layer 212 is different than the other hybrid bond layers 214, 216, 218 in that the bond pad 181 of the dummy chip 112 does not form a metallurgical bond with a through-silicon via in the base semiconductor chip 102. An insulating bond is formed between insulating layers on the front surface of the dummy chip 116 and an insulating film on the base semiconductor chip 102. However, the bond pad 181 of the dummy chip 112 is brought into contact or close proximity to bulk substrate material of the base semiconductor chip 102 rather than a through-silicon via or other interconnect. Thus, heat from the high heat producing portion 104 dissipates through the bond pad 181, thermal pipe 182, bond pad 183, thermal pipe 184, bond pad 185, thermal pipe 186, bond pad 187, and thermal pipe 188 to the back surface of the dummy chip 118.

A similar arrangement is provided in dummy component stack 120. The hybrid bond layer 228 joins the top dummy chip 128 to the dummy chip 126 forming a metallurgical bond between a bond pad 197 of dummy chip 128 and a thermal pipe 196 of dummy chip 126, as well as an insulating bond between an insulating layer on the front surface of the dummy chip 128 and an insulating film on the back surface of the dummy chip 126. A similar hybrid bond layer 226 joins the dummy chip 126 to the dummy chip 124 such that the bond pad 195 of dummy chip 126 is metallurgically bonded to the thermal pipe 194 of dummy chip 124, and an insulating bond is formed between insulating layers on the front surface of the dummy chip 126 and the back surface of the dummy chip 124. A similar hybrid bond layer 224 joins the dummy chip 124 to the dummy chip 122 such that the bond pad 193 of dummy chip 124 is metallurgically bonded to the thermal pipe 192 of dummy chip 122, and an insulating bond is formed between insulating layers on the front surface of the dummy chip 124 and the back surface of the dummy chip 122.

A hybrid bond layer 222 joins the dummy chip 122 to the base semiconductor chip 102 The hybrid bond layer 222 is different than hybrid bond layers 224, 226, 228 in that the bond pad 191 of the dummy chip 122 does not form a metallurgical bond with a through-silicon via in the base semiconductor chip 102. An insulating bond is formed between insulating layers on the front surface of the dummy chip 126 and an insulating film on the base semiconductor chip 102. However, the bond pad 191 of the dummy chip 122 is brought into contact or close proximity to bulk substrate material of the base semiconductor chip 102 rather than a through-silicon via or other interconnect. Thus, heat from the high heat producing portion 106 dissipates through the bond pad 191, thermal pipe 192, bond pad 193, thermal pipe 194, bond pad 195, thermal pipe 196, bond pad 197, and thermal pipe 198 to the back surface of the dummy chip 128.

In the example of FIG. 3, each of the semiconductor chip 102 and the stacked chips 132, 134, 136, 138 includes plural through-silicon vias 260, 252, 254, 246, 258 respectively. Likewise, the stacked chips include 132, 134, 136, 138 include plural bond pads 251, 253, 355, 257. The through-silicon vias 260, 252, 254, 256, 258 can be composed of a variety of different conductor materials such as copper, gold, aluminum, platinum, palladium, combinations of these or the like and will typically include an insulating liner layer of silicon dioxide or other insulating material to provide isolation from the surrounding semiconductor materials. The bond pads 251, 253, 255, 257 can be composed of a variety of different conductor materials such as copper, gold, aluminum, platinum, palladium, combinations of these or the like.

Hybrid bond layers join adjacent stacked chips 132, 134, 136, 138 and join the bottom chip 132 in the chip stack 130 to the base semiconductor chip 102. A hybrid bond layer 238 forms a metallurgical bond between bond pads 257 of chip 138 and through-silicon vias 256 of chip 136 and forms an insulating bond (e.g., an oxide/oxynitride bond) between insulating layers of these chips. A hybrid bond layer 236 forms a metallurgical bond between bond pads 255 of chip 136 and through-silicon vias 254 of chip 134 and forms an insulating bond (e.g., an oxide/oxynitride bond) between insulating layers of these chips. A hybrid bond layer 234 forms a metallurgical bond between bond pads 253 of chip 134 and through-silicon vias 252 of chip 132 and forms an insulating bond (e.g., an oxide/oxynitride bond) between insulating layers of these chips. A hybrid bond layer 232 forms a metallurgical bond between bond pads 251 of chip 132 and through-silicon vias 260 of base semiconductor chip 102 and forms an insulating bond (e.g., an oxide/oxynitride bond) between insulating layers of these chips.

Figure 4:
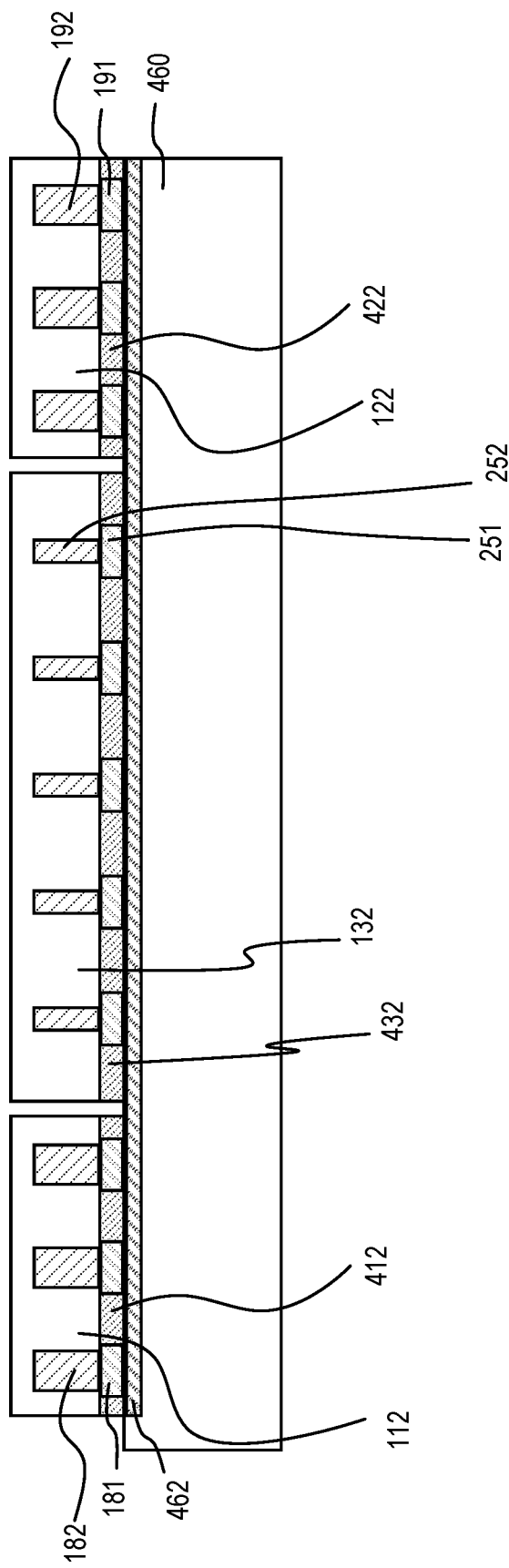
FIG. 4 sets forth a sectional view of a portion of an example process flow for fabricating a semiconductor chip device integrating thermal pipes in three-dimensional packaging according to some implementations.

For further explanation, an example process flow for fabricating the semiconductor chip device 100 depicted in FIGS. 1 and 3 will now be described in conjunction with FIGS. 4-16. FIG. 4 is a sectional view that depicts the semiconductor chip 132, the dummy chip 112, and the dummy chip 122 placed on a carrier wafer 460. The carrier wafer 460 can be composed of silicon, other semiconductor materials, various types of glasses or other carrier substrate materials. In some examples, the dummy chips 112, 122 and the semiconductor chip 132 can be mounted to the carrier wafer 460 by a hybrid bond. In such examples, the carrier wafer 460 is treated with an insulating film 462 such as an oxynitride film that will bond with an insulating layer 412 (e.g., an oxide layer) of the dummy chip 112, an insulating layer 422 of the dummy chip 122, and an insulating layer 432 of semiconductor chip 132. However, it will be understood that the semiconductor chip 132, the dummy chip 112, and the dummy chip 122 can be mounted on the carrier wafer 460 by a die-attach film or other adhesive that remains in place until the carrier wafer 460 is removed at a later step.

At this stage, the dummy chips 112 and 122 and the semiconductor chip 132 have not undergone thinning or reveal of the through-silicon vias 252 of the semiconductor chip 132, thermal pipes 182 of the dummy chip 112, or thermal pipes 192 of the dummy chip 122. Note that the dummy chip 112 and the dummy chip 160 are laterally separated from the semiconductor chip 132 to establish gaps that will eventually be filled by insulating layers 142, 144. As additional dummy chips such as 114 and 124 and additional semiconductor chips such as semiconductor chip 134 are stacked on the arrangement depicted in FIG. 5, the height of the gaps and will increase correspondingly.

Figure 5:
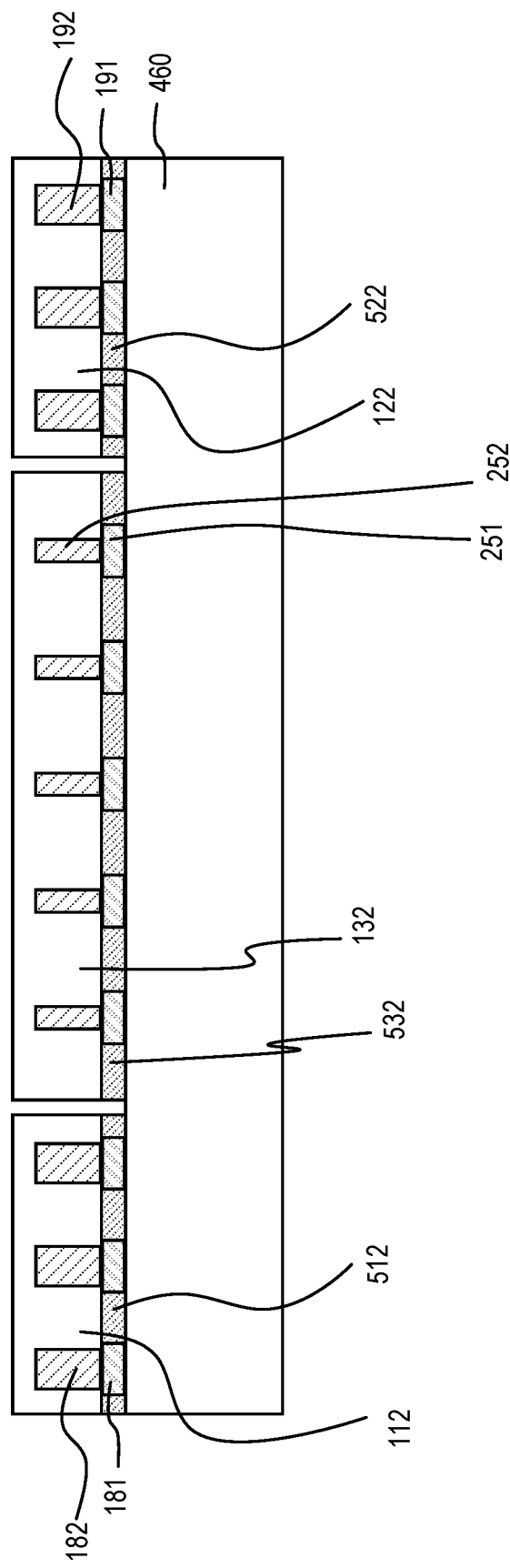
FIG. 5 is another portion of the example process flow for fabricating a semiconductor chip device integrating thermal pipes in three-dimensional packaging according to some implementations.

Moving to FIG. 5, the semiconductor chip 132, the dummy chip 112, the dummy chip 122, and the carrier wafer 460 undergo an annealing process to form a hybrid bond 512 between the dummy chip 112 and the carrier wafer 460, a hybrid bond 522 between the dummy chip 122 and the carrier wafer 460, and a hybrid bond 532 between the semiconductor chip 132 and the carrier wafer 460. The annealing process creates a bond (e.g., an oxide-oxynitride bond) between the insulating layers 412, 422, 432 and the insulating film 462, which are no longer depicted in FIG. 5 for purposes of clarity.

Figure 6:
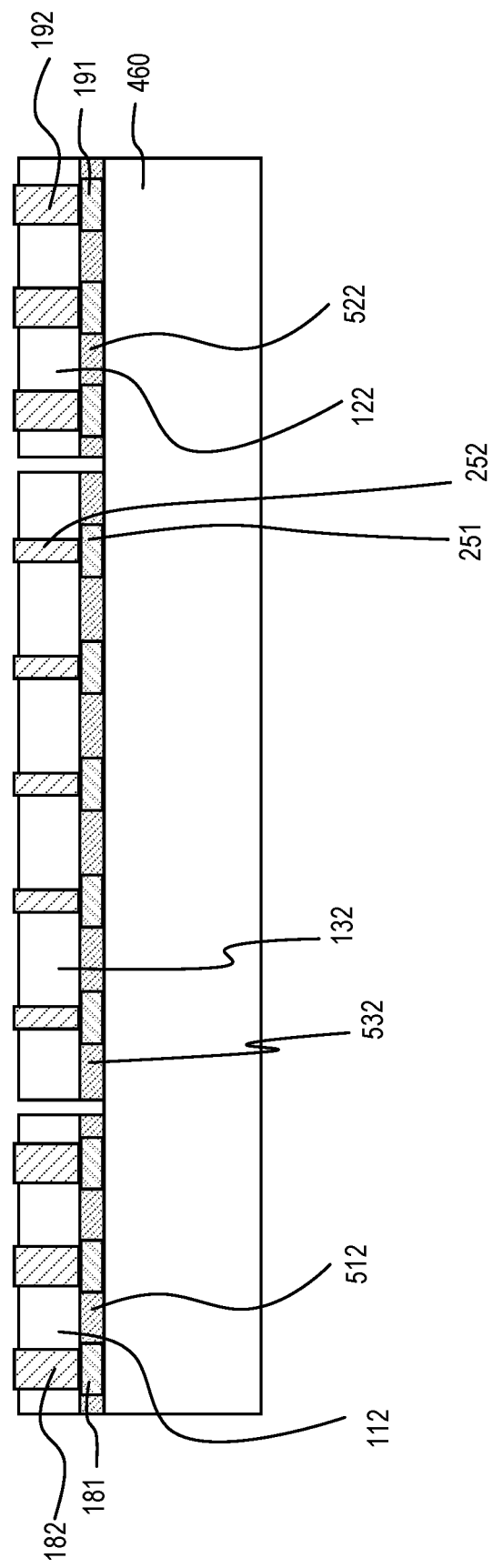
FIG. 6 sets forth a cross section block diagram of another example semiconductor chip device integrating thermal pipes in three-dimensional packaging according to some implementations of the present disclosure.

Moving to FIG. 6, after the dummy chips 112 and 122 and the semiconductor chip 132 are mounted to the carrier wafer 460, the dummy chips 112 and 122 and the semiconductor chip 132 are thinned to reveal the through-silicon vias 252, thermal pipes 182, and thermal pipes 192. In some examples, the reveal process is a soft reveal where the semiconductor chip 132 and dummy chips 112, 122 are subjected to a grinding process to just above the tops of the through-silicon vias 252 and thermal pipes 182, 192, followed by an etch back to reveal the tops of the through-silicon vias 252 and thermal pipes 182, 192. In these examples, the back surfaces of the semiconductor chip 132 and thermal pipes 182, 192 are etched back to slightly below the top of the through-silicon via 252 and thermal pipes 182, 192.

Figure 7:
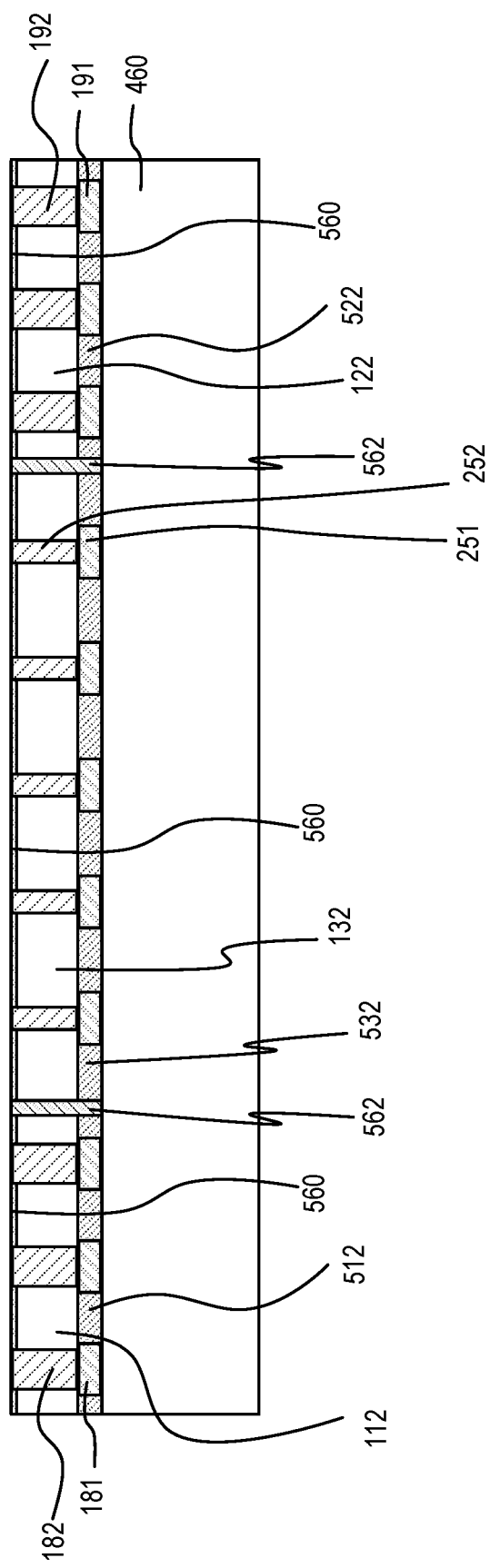
FIG. 7 sets forth a cross section block diagram of another example semiconductor chip device integrating thermal pipes in three-dimensional packaging according to some implementations of the present disclosure.

Continuing with FIG. 7, a double deposition process is used to establish an insulating film 560 such as an oxynitride film and insulating material 562 composed of oxide (e.g., silicon oxide). In some examples, the insulating film 560 and the oxide insulating material 562 are deposited using PECVD to coat the dummy chips 112, 122 and the semiconductor chip 132, and to fill the gaps therebetween. The deposited insulating film 560 and insulating material 562 establish the initial portions of the insulating layers 142, 144. In some examples, a chemical mechanical polishing (CMP) step is performed to thin the insulating layer 562 while leaving in place the insulating material that will form part of insulating layers 142, 144 shown in FIGS. 1 and 3. The CMP process is selective, for example, to oxynitride so that the insulating film 560 remains in place and attack of the underlying dummy chips 112, 122 and the semiconductor chip is minimal. Although the through-silicon vias 252 and thermal pipes 182, 192 are revealed in preparation for metallurgical bonding with the bond pads of the next chips to be respectively stacked thereon. The carrier wafer 460 facilitates these various grinding, etching, deposition, and CMP processes.

Figure 8:
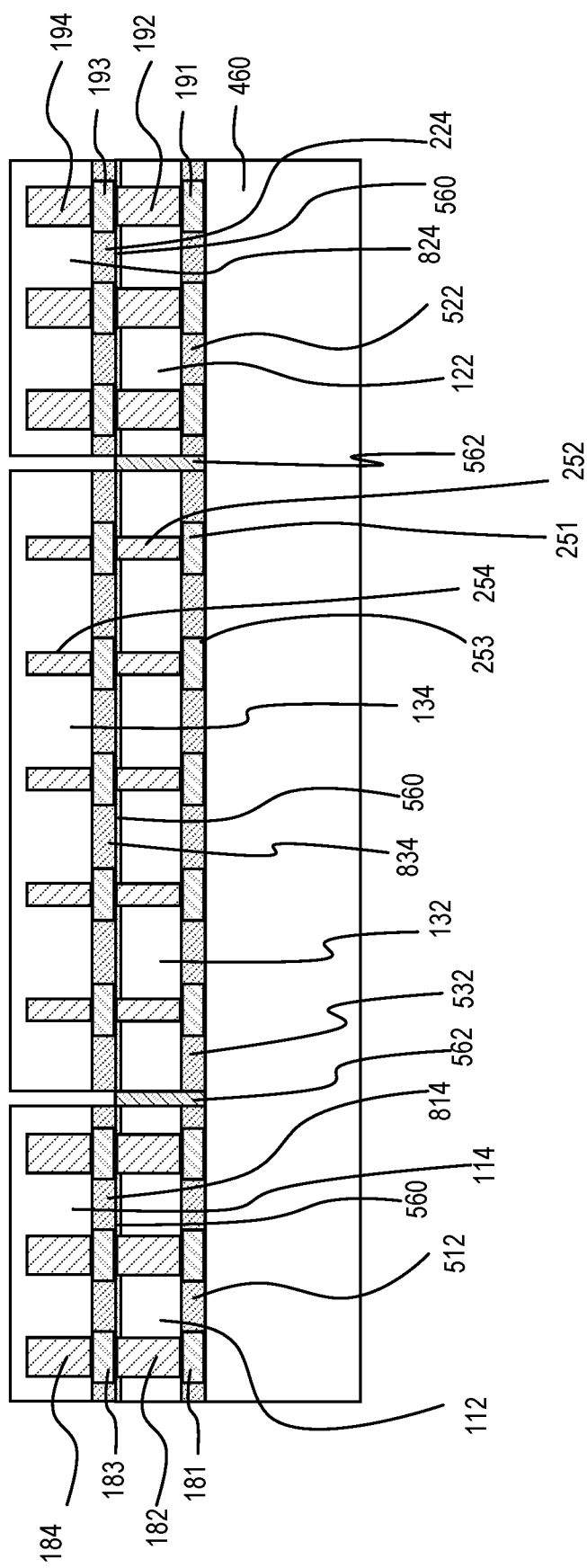
FIG. 8 sets forth a perspective block diagram of another example semiconductor chip device integrating thermal pipes in three-dimensional packaging according to some implementations of the present disclosure.

Moving to FIG. 8, dummy chip 114 having an oxide insulating layer 814 is stacked on dummy chip 112, dummy chip 124 having an oxide insulating layer 824 is stacked on dummy chip 122, and semiconductor chip 134 having an oxide insulating layer 834 is stacked on semiconductor chip 132. An annealing process is performed to create hybrid bonds between the respective oxide insulating layers 814, 824, 834 and the insulating film 560 on the back surfaces of the dummy chips 112, 122 and the semiconductor chip 132. An annealing process is performed to create hybrid bonds between the dummy chip 114 and the dummy chip 112, between the dummy chip 124 and the dummy chip 122, and between the semiconductor chip 134 and the semiconductor chip 132.

Figure 9:
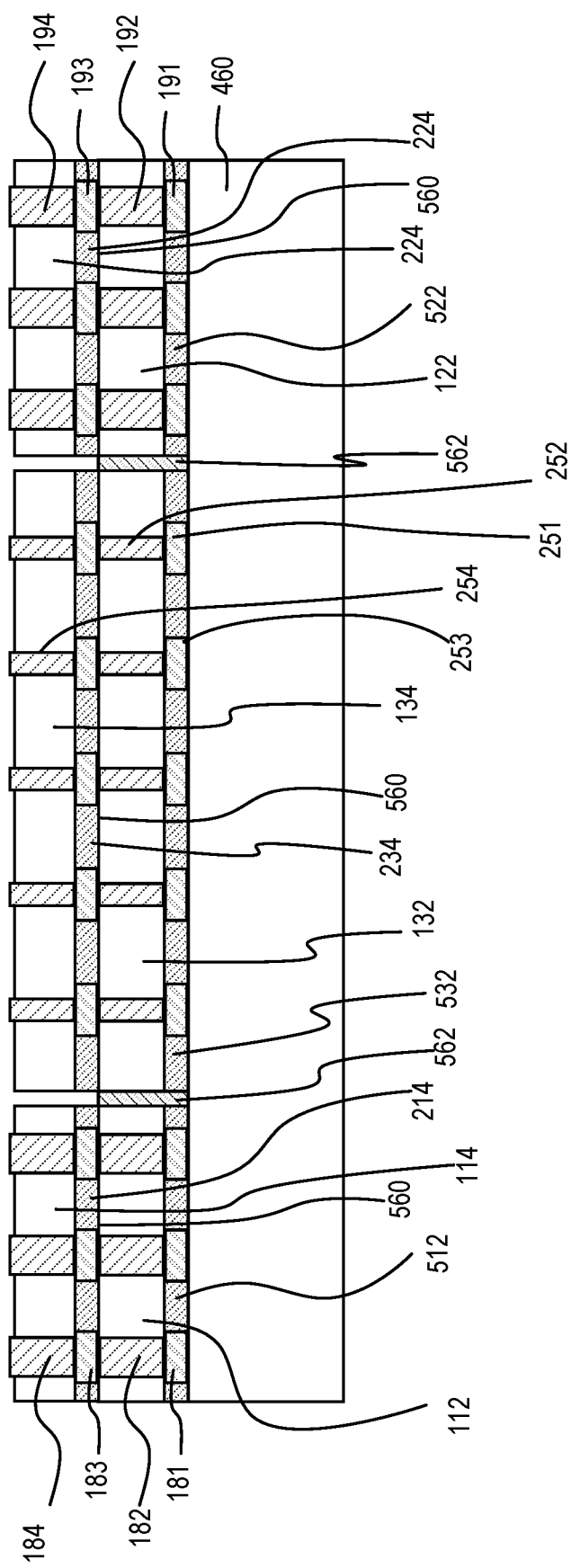
FIG. 9 sets forth a perspective block diagram of another example semiconductor chip device integrating thermal pipes in three-dimensional packaging according to some implementations of the present disclosure.

Moving to FIG. 9, after the annealing process, a hybrid bond 214 is created between the dummy chip 114 and the dummy chip 112, a hybrid bond 224 is created between the dummy chip 124 and the dummy chip 122, and a hybrid bond 234 is created between the semiconductor chip 134 and the semiconductor chip 132. Also note that, with regard to the interface between the semiconductor chips 134 and 132, the bond pads 253 will be bonded to the through-silicon vias 252 as described above. With regard to the interface between the dummy chips 114 and 112, the bond pads 183 will be bonded to the thermal pipes 182 as described above. With regard to the interface between the dummy chips 124 and 122, the bond pads 193 will be bonded to the thermal pipes 192 as described above. The dummy chips 114 and 124 and the semiconductor chip 134 are thinned to reveal the through-silicon vias 254, thermal pipes 184, and thermal pipes 194, as discussed above.

Figure 10:
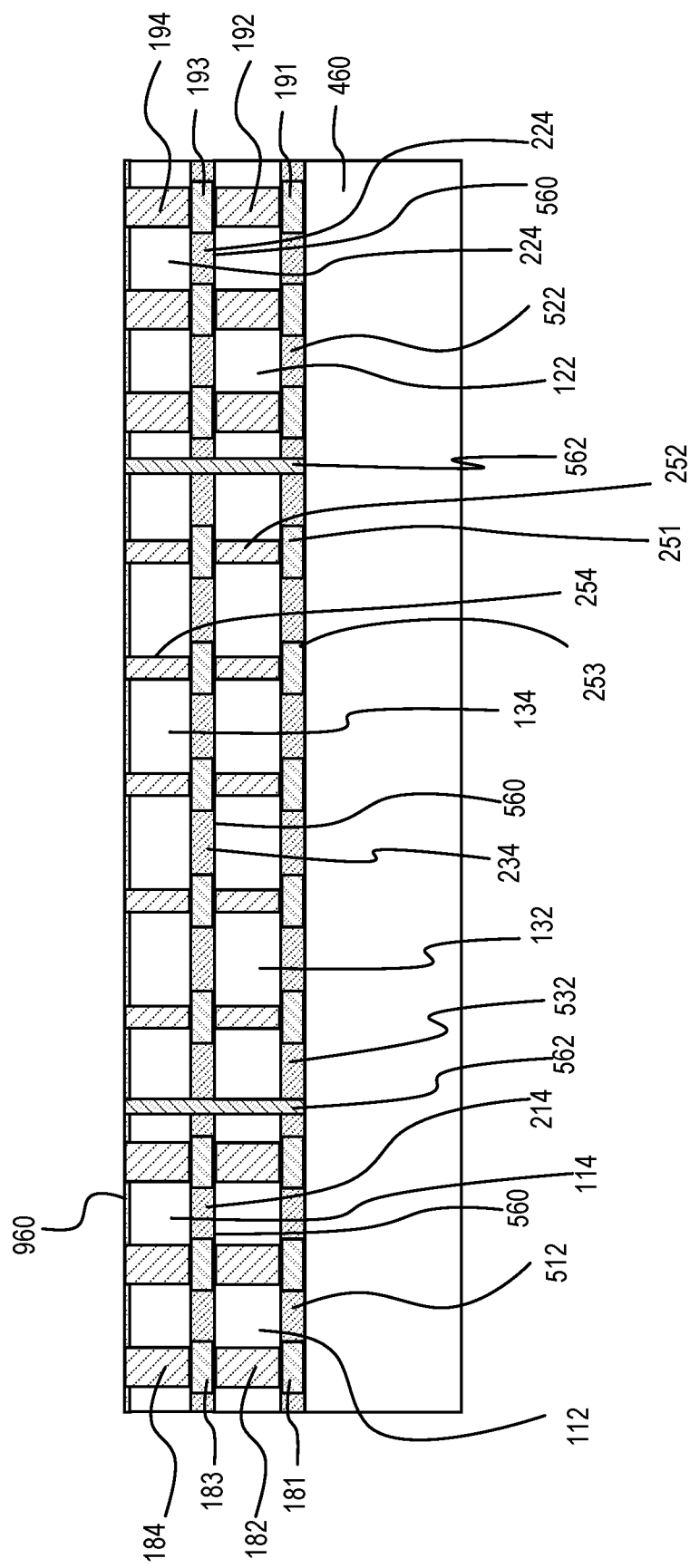
FIG. 10 sets forth a perspective block diagram of another example semiconductor chip device integrating thermal pipes in three-dimensional packaging according to some implementations of the present disclosure.

Moving to FIG. 10, a double deposition process is used to establish an insulating film 960, such as an oxynitride film, and an additional insulating material 562. In some examples, the insulating film 960 and the oxide insulating material 562 are deposited using plasma enhanced chemical vapor deposition to coat the dummy chips 114 and 124 and the semiconductor chip 134 and fill the gaps therebetween to establish the additional portions of the insulating layers 142 and 144 shown in FIGS. 1 and 3. In some examples, a chemical mechanical polishing (CMP) step is performed to thin the insulating layer 962 while leaving in place in the insulating material 562 that will form insulating layers 142 and 144. The CMP process is selective, for example, to oxynitride so that the insulating film 560 remains in place and attack of the underlying dummy chips 114 and 124 and the semiconductor chip 134 is minimal, although the through-silicon vias 254 and thermal pipes 184, 194 are revealed in preparation for metallurgical bonding with the bond pads of the next chips to be respectively stacked thereon. The carrier wafer 460 facilitates these various grinding, etching, deposition, and CMP processes. The processes shown in FIGS. 8-10 are repeated to stack additional chips to create chips stacks and dummy component stacked, for example, like the chip stack 130 and dummy component stacks 110, 120 depicted in FIGS. 1 and 2.

Figure 11:
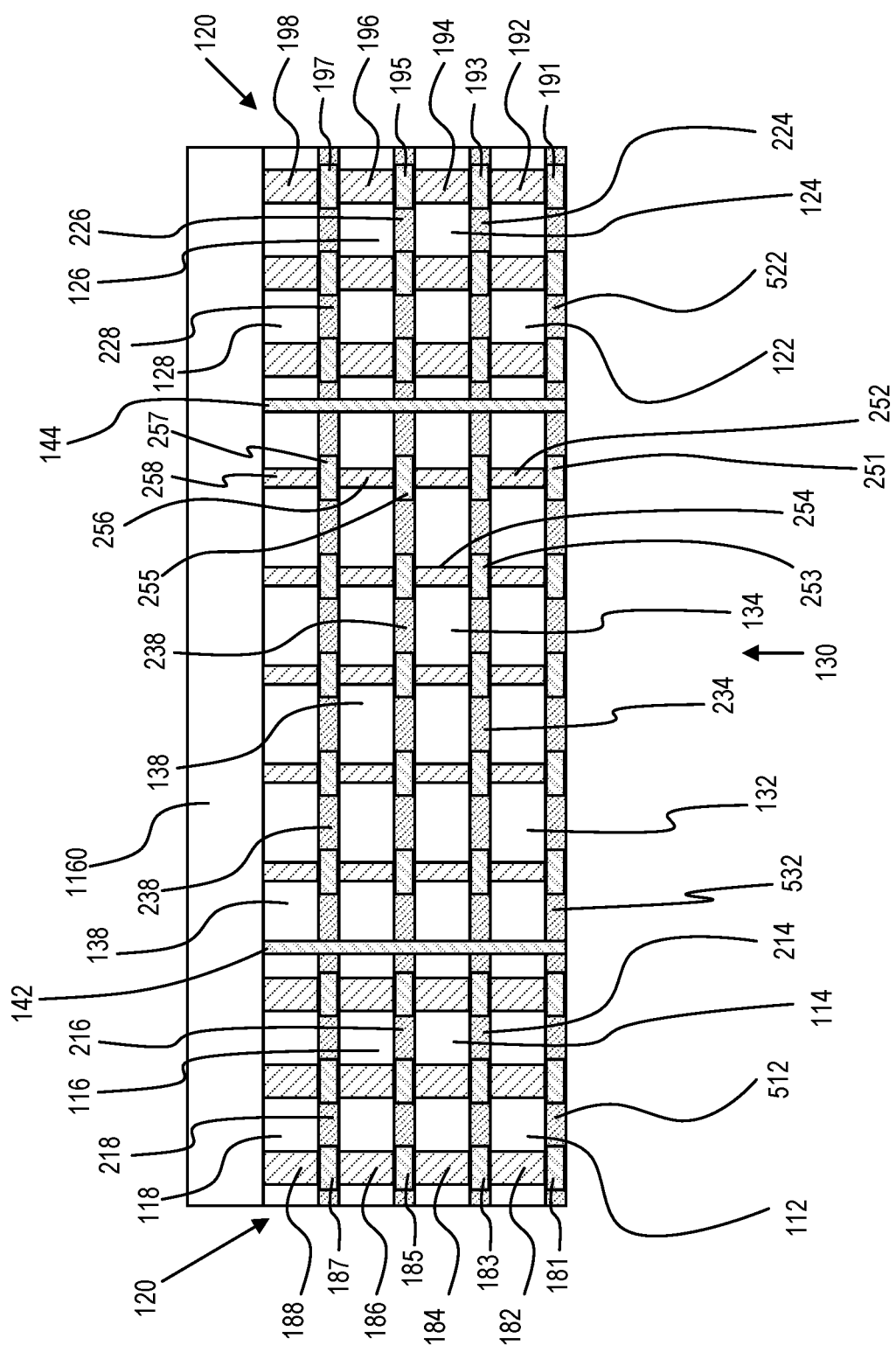
FIG. 11 sets forth a perspective block diagram of another example semiconductor chip device integrating thermal pipes in three-dimensional packaging according to some implementations of the present disclosure.

Moving to FIG. 11, with the dummy component stacks 110, 120 and the chip stack 130 completed, the carrier wafer 460 depicted in FIG. 10 is removed by grinding or other removal process and another carrier wafer 1160 is mounted to the combination of the dummy component stacks 110, 120 and the chip stack 130 on the opposite side of the position that was used for the carrier wafer 460 depicted in the earlier figures. At this point, the chips 132, 134, 136, 138 of the chip stack 130 can be tested to establish whether the chip stack 130 consists of four known good die or not. Testing can be carried out using a testing apparatus, such as a probe or other type of testing device. If the combination of the dummy component stacks 110, 120 and the chip stack 130 successfully passes the testing, then the combination is ready to be mounted to a base semiconductor chip, such as the base semiconductor chip 102 depicted in earlier figures.

Figure 12:
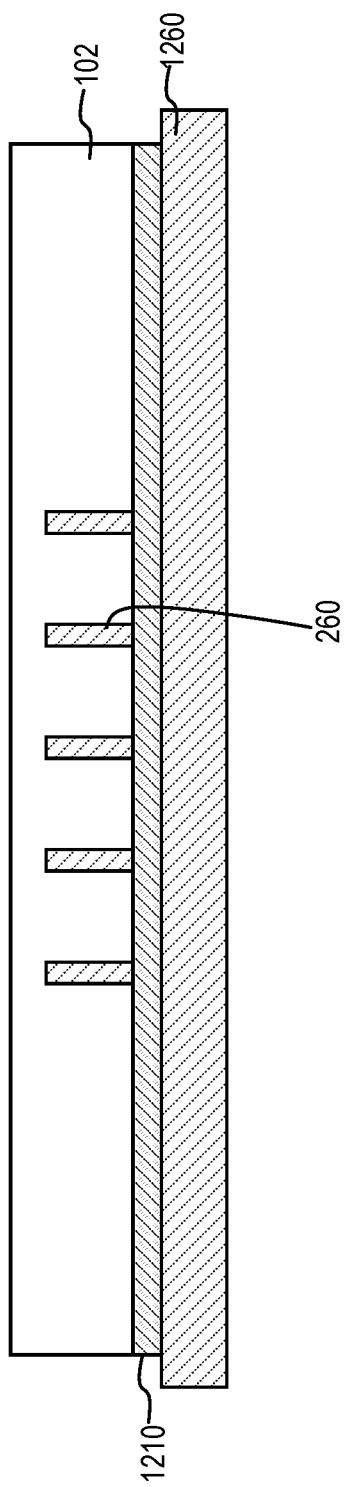
FIG. 12 sets forth a perspective block diagram of another example semiconductor chip device integrating thermal pipes in three-dimensional packaging according to some implementations of the present disclosure.

Moving to FIG. 12, attention is now turned to preparation of the base semiconductor chip 102. FIG. 12 is a sectional view of the semiconductor chip 102 mounted on a carrier wafer 1260. In some variations, the semiconductor chip 102 is mounted by way of a hybrid bond layer 1210, which is similar to the hybrid bond layer described elsewhere herein. In other variations, the semiconductor chip 102 is mounted using a die-attach film or other adhesive. The carrier wafer 1260 is composed of silicon, another semiconductor material, various types of glasses, or other carrier substrate materials. At this point, the semiconductor chip 102 has not been thinned and, as such, the through-silicon vias 260 have not been revealed.

Figure 13:
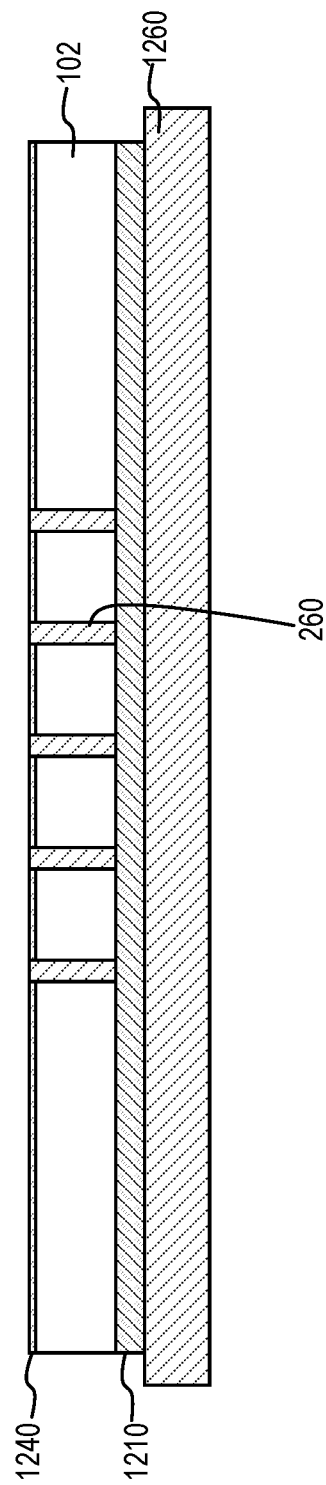
FIG. 13 sets forth a perspective block diagram of another example semiconductor chip device integrating thermal pipes in three-dimensional packaging according to some implementations of the present disclosure.

Moving to FIG. 13, a reveal process is performed wherein the semiconductor chip 102 is subjected to a grinding process to just above the tops of the through-silicon vias 260, followed by an etch back to reveal the tops of the through-silicon vias 260. Next, a deposition process is used to establish an insulating film 1240 (e.g., silicon oxynitride) that will form part of the hybrid bond layers 212, 222, 232 depicted in FIG. 3. Like the other insulating film applications described elsewhere herein, the insulating film 1240 can be on the order of a fraction of a micron in thickness.

Figure 14:
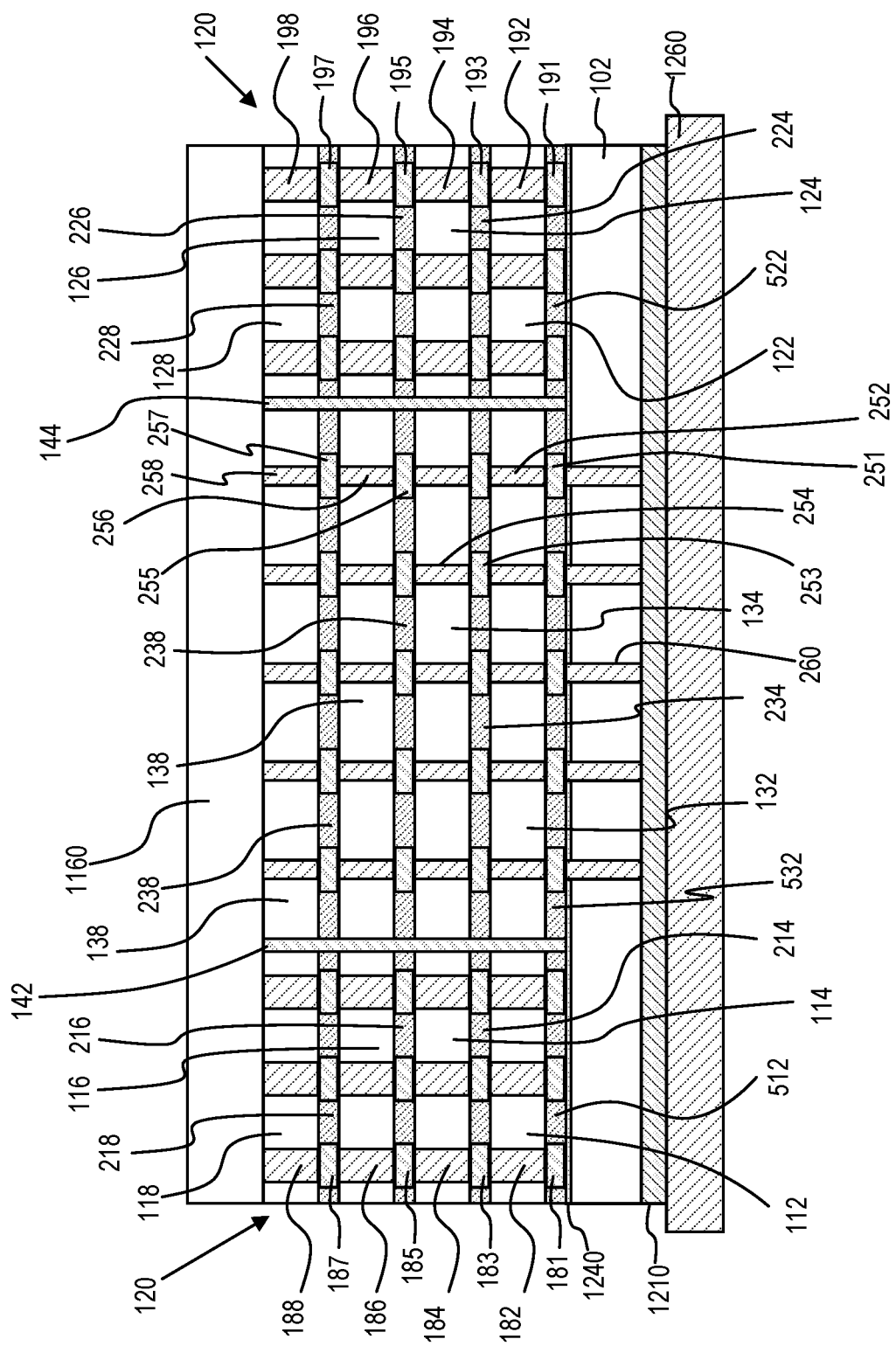
FIG. 14 sets forth a perspective block diagram of another example semiconductor chip device integrating thermal pipes in three-dimensional packaging according to some implementations of the present disclosure.
Figure 15:
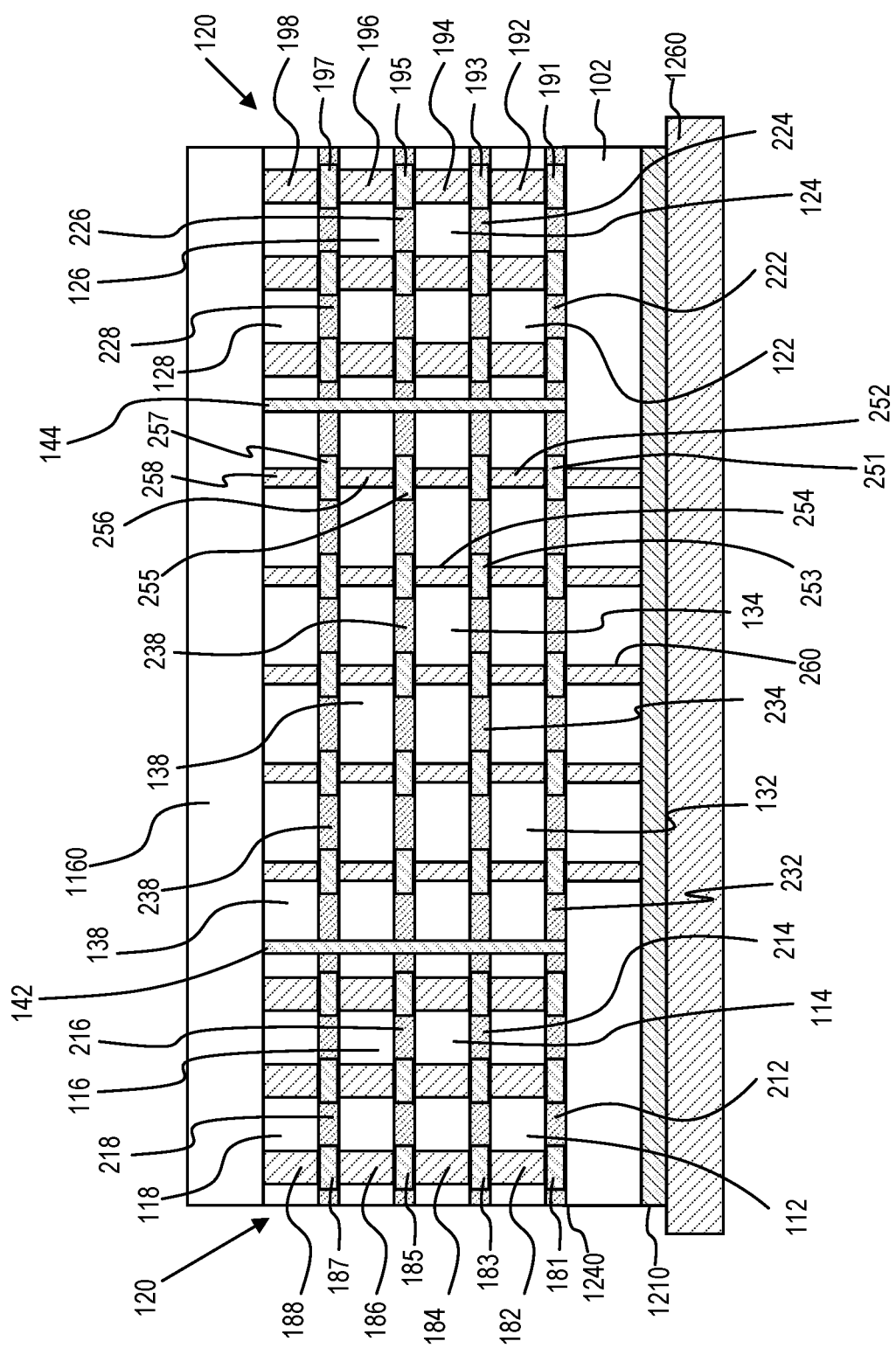
FIG. 15 sets forth a perspective block diagram of another example semiconductor chip device integrating thermal pipes in three-dimensional packaging according to some implementations of the present disclosure.

Continuing with FIG. 14, the combination of the dummy component stacks 110, 122 and the chip stack 130, supported by the carrier wafer 1160, is placed on the semiconductor chip 102 where the hybrid bond layers 512, 522, 532 are in place for bonding to the insulating film 1240. After an annealing process, hybrid bonds 212, 222 are created between the bottom dummy chips 112, 122 and the base semiconductor chip 102 and hybrid bond 232 is created between the bottom stacked chip 132 and the base semiconductor chip 102, as shown in FIG. 15.

Figure 16:
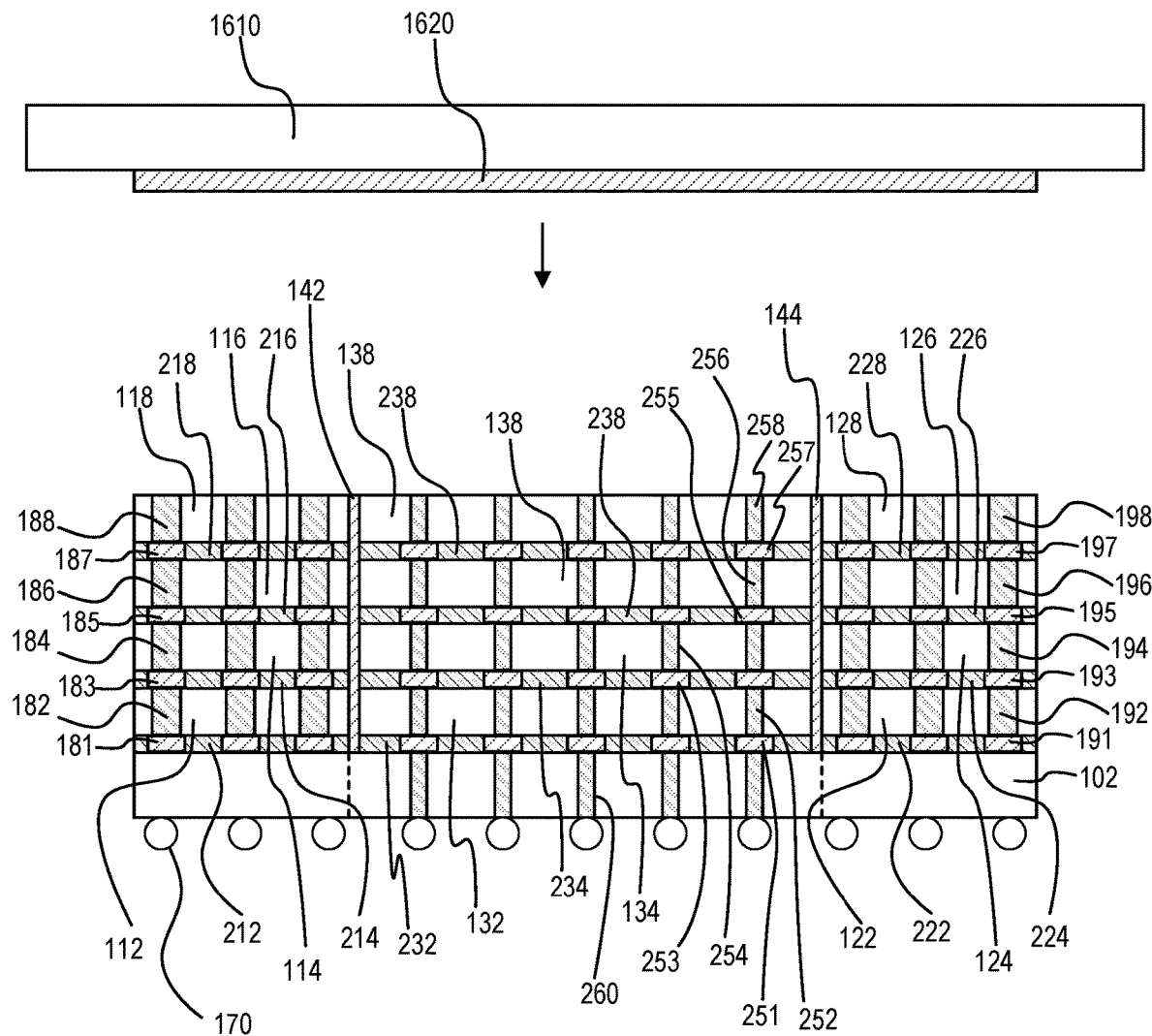
FIG. 16 sets forth a perspective block diagram of another example semiconductor chip device integrating thermal pipes in three-dimensional packaging according to some implementations of the present disclosure.

Moving to FIG. 16, the carrier wafers 1160 and 1260 are removed, for example, by grinding or other removal processes to produce the semiconductor chip device 100 depicted in FIG. 16. Note that prior to removal of the carrier wafer 1160, but after the removal of the carrier wafer 1260, the I/Os 170 are mounted on the semiconductor chip 102. In some implementations, following fabrication of the semiconductor chip device 100, a thermal management device such as the depicted heat spreader 1610 is mounted on the dummy chips 118, 128 and the top chip 138 of the chip stack 130 to provide thermal management. In some examples, a suitable thermal interface material 1620 is interposed between the heat spreader 1610 and the dummy chips 118, 128 and the chip 138. The heat spreader 1610 can be composed of well-known heat transfer materials, such as copper, aluminum, stainless steel, or the like.

Figure 17:
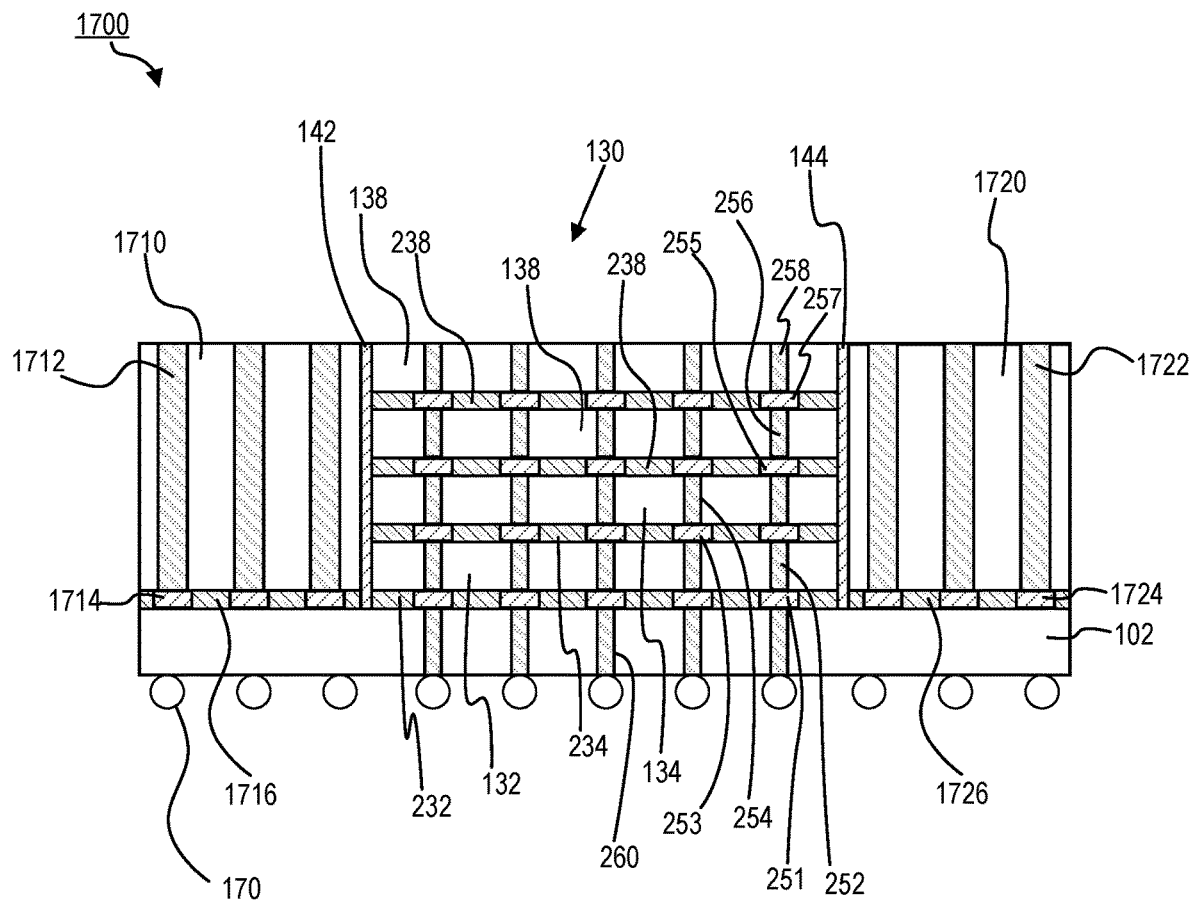
FIG. 17 sets forth an exploded view of an example semiconductor chip device integrating thermal pipes in three-dimensional packaging according to some implementations of the present disclosure.

The techniques described herein can be expanded to include dummy component structures other than those depicted in FIGS. 1 and 3. For example, and as shown in FIG. 17, which is a sectional view like FIG. 3, the semiconductor chip device 1700 is configured with monolithic dummy components 1710, 1720. The monolithic dummy component 1710 includes plural thermal pipes 1712 and bond pads 1714. The monolithic dummy component 1720 includes plural thermal pipes 1722 and bond pads 1724. A hybrid bond layer 1716, 1726 is formed between the dummy components 1710, 1720 and the semiconductor chip 102. In some examples, the height of the dummy components 1710, 1720 is the same as the height of the chip stack 130.

Figure 18:
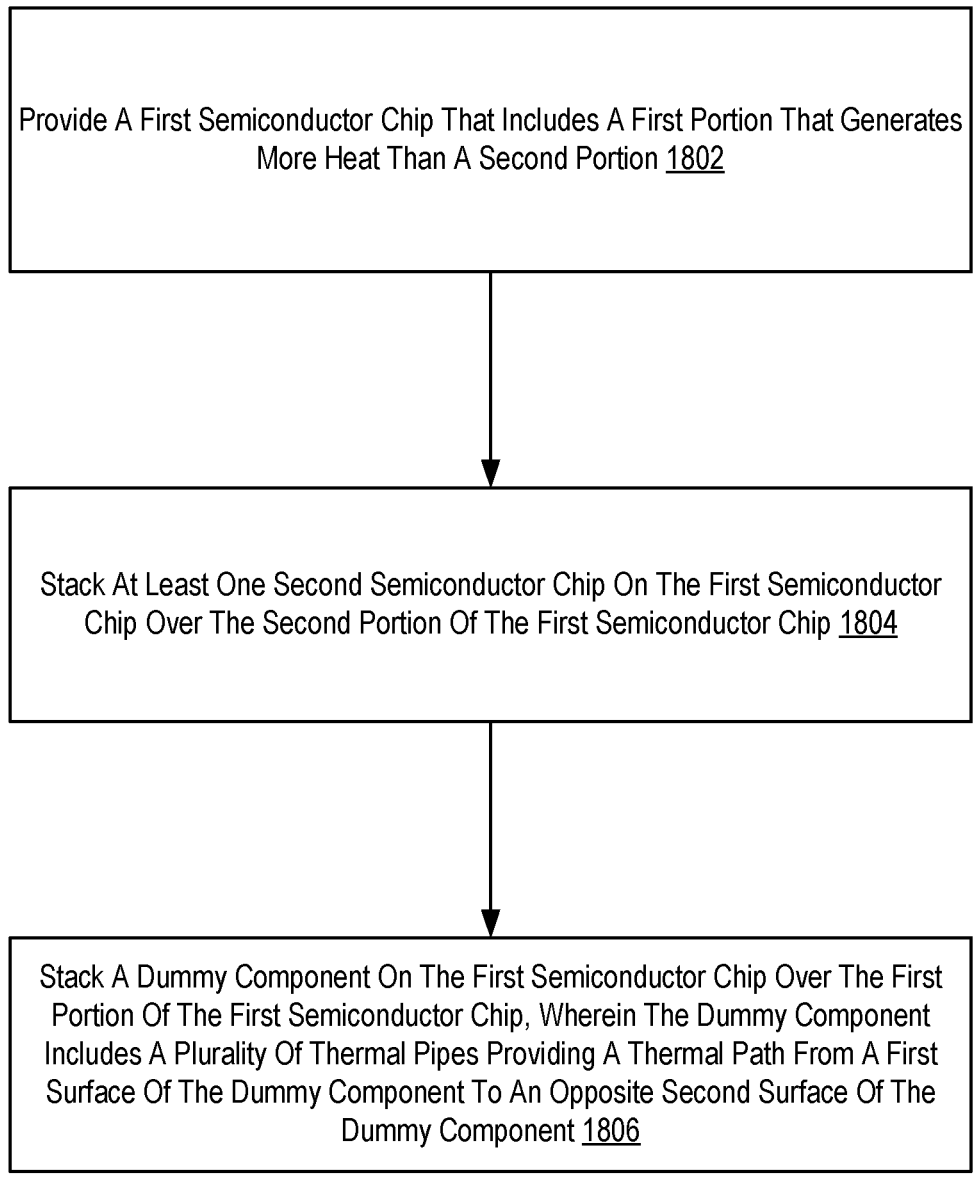
FIG. 18 is a flowchart of an example method of fabricating a semiconductor chip device integrating thermal pipes in three-dimensional packaging according to some implementations.

For further explanation, FIG. 18 sets forth a flow chart illustrating an example method of fabricating a semiconductor device integrating thermal pipes in three-dimensional packaging in accordance with some implementations of the present disclosure. The example method of FIG. 18 includes providing 1802 a first semiconductor chip that includes a first portion that generates more heat than a second portion.

In some implementations, providing 1802 a first semiconductor chip that includes a first portion that generates more heat than a second portion is carried out by mounting a base semiconductor chip on a carrier wafer. The base semiconductor chip includes a high heat generating first portion and a low heat generating second portion. In some examples, the high heat generating first portion includes one or more processor cores. In some examples, the low heat generating second portion includes bus logic, caches, I/O logic, or other logic that is not a processor core. In some implementations, the second portion includes one or more through-silicon vias. In these implementations, providing 1802 a first semiconductor chip that includes a first portion that generates more heat than a second portion also includes grinding and/or etching the back surface of the base semiconductor chip to expose the through-silicon vias. In some variations, after reveal of the through-silicon vias, the back surface of the base semiconductor chip is treated with an insulating film such as an oxynitride laminate to facilitate hybrid bonding. In some examples, providing 1802 a first semiconductor chip that includes a first portion that generates more heat than a second portion is carried out as shown and described with reference to FIGS. 12 and 13.

The method of FIG. 18 also includes stacking 1804 at least one second semiconductor chip on the first semiconductor chip over the second portion of the first semiconductor chip. Stacking 1804 the second conductor as described here is carried out by mounting at least one stacked semiconductor chip on the base semiconductor chip over the low heat generating second portion of the stacked semiconductor chip. In some examples, the stacked semiconductor chip is placed on the back surface of the base semiconductor chip such that bond pads of the stacked semiconductor chip align with through-silicon vias of the base semiconductor chip. In some implementations, a hybrid bond is formed between the stacked semiconductor chip and the base semiconductor chip in which an insulating layer (e.g., an oxide layer) of the stacked semiconductor chip bonds to an insulating film on the base semiconductor chip and a metallurgical bond is formed between bond pads interspersed in the insulating layer of the stacked semiconductor chip and the through-silicon vias of the base semiconductor chip. In some examples, stacking 1804 the second semiconductor chip on the first semiconductor chip is carried out as shown and described with reference to FIGS. 14 and 15 in which a stacked semiconductor chip 132 is mounted on a base semiconductor chip 102.

The method of FIG. 18 also includes stacking 1806 a dummy component on the first semiconductor chip over the first portion of the first semiconductor chip. In the method of FIG. 18, the dummy component includes a plurality of thermal pipes providing a thermal path from a first surface of the dummy component to an opposite, second surface of the dummy component. Stacking 1806 the dummy component as described here is carried out by mounting a dummy component on the base semiconductor chip over the high heat generating first portion of the stacked semiconductor chip. The dummy component includes multiple thermal pipes that provide a thermal pathway from a bottom (or front) surface of the dummy component to a top (or back) surface of the dummy component, where the bottom surface is mounted to the base semiconductor chip. In some implementations, a hybrid bond is formed between the dummy component and the base semiconductor chip in which an insulating layer (e.g., an oxide layer) of the dummy component bonds to an insulating film on the base semiconductor chip and bond pads interspersed in the insulating layer of the stacked semiconductor chip and interface with a substrate of the base semiconductor chip. In some examples, stacking 1806 a dummy component on the first semiconductor chip over the first portion of the first semiconductor chip is carried out as shown and described with reference to FIGS. 14 and 15 in which a dummy chip 112 is mounted on a base semiconductor chip 102.

For further explanation, FIG. 19 sets forth a flow chart illustrating an example method of fabricating a semiconductor device integrating thermal pipes in three-dimensional packaging in accordance with some implementations of the present disclosure. FIG. 19 is similar to FIG. 18, except that in the method of FIG. 18 stacking 1804 the second semiconductor chip on the first semiconductor chip includes mounting 1902 a stack of second semiconductor chips on the first semiconductor chip. In some implementations, mounting 1902 a stack of second semiconductor chips is carried out by mounting a stack of semiconductor chips to the base semiconductor chip, where adjacent chips in the stack are bonded together by a hybrid bond. That is, in the stack of semiconductor chips, an insulating layer on a bottom surface of a first chip is bonded to an insulating film on a top surface of a second chip. In such an implementation, bond pads interspersed in the insulating layer of the first chip are metallurgically bonded to through-silicon vias in the second chip. In some examples, mounting 1902 the stack of plural second semiconductor chips is carried out as shown and described with reference to FIGS. 14 and 15 in which a stack of semiconductor chips 132, 134, 136, 138 is mounted on a base semiconductor chip 102.

Also, in the method FIG. 19, stacking 1806 the dummy component on the first semiconductor chip includes mounting 1904 a stack of dummy chips on the first semiconductor chip. In some implementations, mounting 1904 a stack of dummy chips is carried out by mounting a stack of dummy chips to the base semiconductor chip, where adjacent chips in the stack are bonded together by a hybrid bond. That is, in the stack of dummy chips, an insulating layer on a bottom surface of a first dummy chip is bonded to an insulating film on a top surface of a second chip. In such implementations, bond pads interspersed in the insulating layer of the first dummy chip are metallurgically bonded to thermal pipes in the second chip. The dummy chips are stacked such that the thermal pipes in each dummy chip align with one another. In some examples, mounting 1904 the stack of dummy chips on the first semiconductor chip is carried out as shown and described with reference to FIGS. 14 and 15 in which a stack of dummy chips 112, 114, 116, 118 is mounted on a base semiconductor chip 102.

Figure 20:
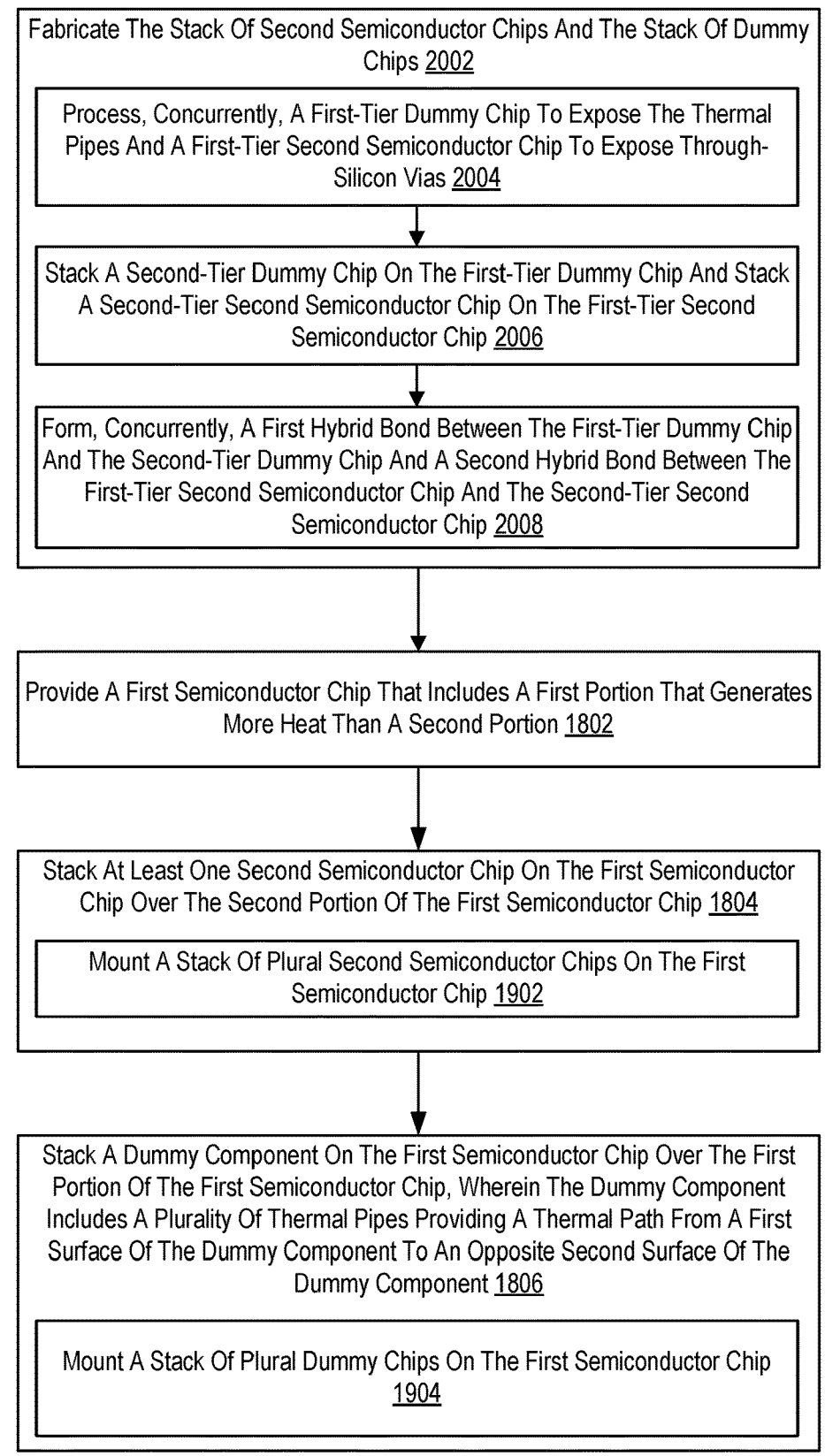
FIG. 20 is a flowchart of another example method of fabricating a semiconductor chip device integrating thermal pipes in three-dimensional packaging according to some implementations.

For further explanation, FIG. 20 sets forth a flow chart illustrating an example method of fabricating a semiconductor device integrating thermal pipes in three-dimensional packaging in accordance with some implementations of the present disclosure. FIG. 20 expands the method set forth in FIG. 19. The method of FIG. 20 includes fabricating 2002 the stack of second semiconductor chips and the stack of dummy chips. In the example of FIG. 20, fabricating 2002 the stack of second semiconductor chips and the stack of dummy chips includes processing 2004, concurrently, a first-tier dummy chip to expose the thermal pipes and a first-tier second semiconductor chip to expose through-silicon vias. In some implementations, processing 2004 the first-tier dummy chip the first-tier second semiconductor chip as described herein includes placing a bottom dummy chip of the stack of dummy chips and a bottom semiconductor chip of the stack of second semiconductor chips on a carrier wafer. In the same process, the top surface of the bottom dummy chip and the top surface of the bottom semiconductor chip are subjected to grinding to remove substrate material. In the same process, etching is performed to reveal the thermal pipes in the bottom dummy chip and the through-silicon vias in the bottom semiconductor chip. In some examples, an insulating film such as oxynitride is deposited on the bottom dummy chip and bottom semiconductor chip. In some implementations, processing 2004 the first-tier dummy chip and the second first-tier second semiconductor chip is carried out as shown and described with reference to FIGS. 4-7.

The method of FIG. 20 also includes stacking 2006 a second-tier dummy chip on the first-tier dummy chip and stacking a second-tier second semiconductor chip on the first-tier second semiconductor chip. In some implementations, the stacking 2006 includes stacking another dummy chip on the bottom dummy chip such that the thermal pipes of the stacked dummy chip align with the thermal pipes of the bottom dummy chip. In some implementations, the stacking 2006 also includes stacking another semiconductor chip on the bottom semiconductor chip such that bond pads of the stacked semiconductor chip align with through-silicon vias of the bottom semiconductor chip. In some examples, the stacking 2006 process is carried out as shown and described with reference to FIG. 8.

The method of FIG. 20 also includes forming 2008, concurrently, a first hybrid bond between the first-tier dummy chip and the second-tier dummy chip and forming a second hybrid bond between the first-tier second semiconductor chip and the second-tier second semiconductor chip. In some implementations, the forming 2008 operations are carried out by performing an annealing process to create a hybrid bond between the stacked dummy chip and the bottom dummy chip. An insulating bond (e.g., an oxide/oxynitride bond) is formed between an insulating layer of the stacked dummy chip and an insulating film of the bottom dummy chip, and a metallurgical bond is created between bond pads of the stacked dummy chip and thermal pipes of the bottom dummy chip. In the same annealing process, a hybrid bond is created between the stacked semiconductor chip and the bottom semiconductor chip. An insulating bond (e.g., an oxide/oxynitride bond) is formed between an insulating layer of the stacked semiconductor chip and an insulating film of the bottom semiconductor chip, and a metallurgical bond is created between bond pads of the stacked semiconductor chip and through-silicon vias of the bottom semiconductor chip. In some examples, the forming 2008 process is carried out as shown and described with reference to FIG. 9. After additional tiers (if any) of the stack of dummy chips and stack of semiconductor chips are completed, a carrier wafer is attached to the top tier of the dummy chip stack and the semiconductor chip stack. The bottom carrier wafer is also removed. In this way, the stacks are readied for mounting on the base semiconductor chip (as shown, for example, in FIG. 11).

In view of the foregoing, it will be appreciated that integrating thermal pipes in three-dimensional packaging in accordance with the present disclosure is advantageous in many respects. As discussed above, a dummy component that includes metal thermal pipes provides a thermal pathway from a first surface (e.g., a bottom surface) of the dummy component to an opposite second surface (e.g., a top surface). As discussed above, the dummy component can be stacked on chip in a three-dimensional package to improve thermal flux transfer through the dummy component from heat generating portions of the chip to the opposite surface of the dummy component. As discussed above, the dummy component can be a passive silicon component that does not include layers of dielectric material and metallization, or integrated circuitry, that could inhibit thermal flux transfer. As discussed above, additional active semiconductor chips can be stacked on other portions of the chip that generate a lower amount of heat relative to the high-heat generating portions. Where the dummy component is composed of multiple stacked dummy chips, such dummy chips can be processed in the same process steps as other semiconductor chips and therefore do not require additional processing steps. For example, exposing the thermal pipes in the dummy chip and the through-silicon vias in the other chips can be performed by the same reveal process. Moreover, after stacking an additional dummy chip and semiconductor chips, the same bonding process can be used to generate bonds between adjacent dummy chips in a stack and adjacent semiconductor chips in a stack. Thus, the addition of dummy chips having thermal pipes does not add additional processing steps or cost to fabrication of the semiconductor chip device. The heat transfer provided by the thermal pipes improves processor performance and can extend the life of the processor.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A semiconductor chip device comprising:
 a first semiconductor chip including a first portion and a second portion, wherein each of the first portion and the second portion includes logic, wherein the first portion and the second portion are separated by an insulating layer;
 a second semiconductor chip stacked on the first semiconductor chip over the second portion; and
 a dummy component stacked on the first semiconductor chip over the first portion, wherein the dummy component includes a plurality of thermal pipes providing a thermal path from a first surface of the dummy component to an opposite second surface of the dummy component, the plurality of thermal pipes extending from the first surface to the opposite second surface of the dummy component.

2. The semiconductor chip device of claim 1, wherein the first portion of the first semiconductor chip generates more heat than the second portion of the first semiconductor chip, and wherein the plurality of thermal pipes extending from the first surface to the opposite second surface of the dummy component.

3. The semiconductor chip device of claim 1, wherein the second semiconductor chip is coupled to the first semiconductor chip by a hybrid bond; and wherein the hybrid bond metallurgically couples bond pads on the second semiconductor chip to through-silicon vias in the first semiconductor chip, wherein the first surface of the dummy component is a top surface of the dummy component and the opposite second surface of the dummy component is a bottom surface contacting the first semiconductor chip.

4. The semiconductor chip device of claim 1, wherein the plurality of thermal pipes are respectively coupled to bond pads on the dummy component; and wherein the dummy component is coupled to the first semiconductor chip by a hybrid bond in which the bond pads are coupled to a substrate surface of the first semiconductor chip.

5. The semiconductor chip device of claim 1, where in the dummy component includes plural dummy components stacked together.

6. The semiconductor chip device of claim 1, wherein the dummy component lacks integrated circuitry.

7. The semiconductor chip device of claim 1, wherein one or more of the plurality of thermal pipes are composed of copper.

8. The semiconductor chip device of claim 1, wherein:
the second semiconductor chip is included in a stack of semiconductor chips positioned over the second portion, the stack of semiconductor chips including a bottom semiconductor chip mounted on a back surface of the first semiconductor chip and one or more additional semiconductor chips stacked on the bottom semiconductor chip; and
the dummy component comprises a stack of dummy chips positioned over the first portion, wherein each dummy chip includes a plurality of thermal pipes providing a thermal path from a first surface of the dummy chip to an opposite, second surface of the dummy chip.

9. A device comprising:
a printed circuit board;
a processing component mounted to the printed circuit board; and
one or more memory components mounted to the printed circuit board and coupled to the processing component, wherein the processing component comprises:
a first semiconductor chip comprising a first portion and a second portion, wherein each of the first portion and the second portion includes logic, wherein the first portion and the second portion are separated by an insulating layer;
a stack of second semiconductor chips positioned over the second portion, the stack of second semiconductor chips including a bottom semiconductor chip mounted on a back surface of the first semiconductor chip and one or more additional semiconductor chips stacked on the bottom semiconductor chip; and
a stack of dummy chips positioned over the first portion, wherein each dummy chip includes a plurality of thermal pipes providing a thermal path from a first surface of the dummy chip to an opposite, second surface of the dummy chip, the plurality of thermal pipes extending from the first surface to the opposite second surface of the dummy chip.

10. The device of claim 9, wherein the first portion generates more heat than the second portion.

11. The device of claim 9, wherein the stack of dummy chips includes a bottom dummy chip mounted on the first semiconductor chip and one or more additional dummy chips stacked on the bottom dummy chip; and wherein the plurality of thermal pipes in each of the one or more additional dummy chips aligns with the plurality of thermal pipes in the bottom dummy chip.

12. The device of claim 9, wherein adjacent dummy chips in the stack of dummy chips are coupled by a hybrid bond.

13. The device of claim 12, wherein adjacent second semiconductor chips in the stack of second semiconductor chips are coupled by a hybrid bond, wherein the first surface of the dummy component is a top surface of the dummy component, and wherein the opposite second surface of the dummy component is a bottom surface contacting the first semiconductor chip.

14. The device of claim 9, wherein a heat spreader is positioned on the stack of second semiconductor chips and the stack of dummy chips.

15. The device of claim 9, wherein the first portion of the first semiconductor chip includes one or more processor cores and wherein the second portion of the first semiconductor chip includes logic other than the one or more processor cores.

16. The device of claim 9, wherein one or more of the plurality of thermal pipes are composed of copper.

17. A method of fabricating a semiconductor chip device integrating thermal pipes in three-dimensional packaging, the method comprising:
providing a first semiconductor chip that includes a first portion that generates more heat than a second portion, wherein each of the first portion and the second portion includes logic, wherein the first portion and the second portion are separated by an insulating layer;
stacking at least one second semiconductor chip on the first semiconductor chip over the second portion of the first semiconductor chip; and
stacking a dummy component on the first semiconductor chip over the first portion of the first semiconductor chip, wherein the dummy component includes a plurality of thermal pipes providing a thermal path from a first surface of the dummy component to an opposite second surface of the dummy component, the plurality of thermal pipes extending from the first surface to the opposite second surface of the dummy component.

18. The method of claim 17, wherein:
stacking the at least one second semiconductor chip over the second portion of the first semiconductor chip includes mounting a stack of plural second semiconductor chips on the first semiconductor chip; and
stacking the dummy component on the first semiconductor chip over the first portion of the first semiconductor chip includes mounting a stack of plural dummy chips on the first semiconductor chip.

19. The method of claim 18 further comprising:
fabricating the stack of second semiconductor chips and the stack of dummy chips including:
processing, concurrently, a first-tier dummy chip to expose the thermal pipes and a first-tier second semiconductor chip to expose through-silicon vias;
stacking a second-tier dummy chip on the first-tier dummy chip and stacking a second-tier second semiconductor chip on the first-tier second semiconductor chip; and
forming, concurrently, a first hybrid bond between the first-tier dummy chip and the second-tier dummy chip and a second hybrid bond between the first-tier second semiconductor chip and the second-tier second semiconductor chip.

20. The semiconductor chip device of claim 17, wherein the first portion of the first semiconductor chip includes one or more processor cores and wherein the second portion of the first semiconductor chip includes logic other than the one or more processor cores.

* * * * *